United States Patent
Suehiro et al.

(10) Patent No.: US 7,498,734 B2
(45) Date of Patent: Mar. 3, 2009

(54) LIGHT EMITTING DEVICE WITH WAVELENGTH CONVERTED BY PHOSPHOR

(75) Inventors: Yoshinobu Suehiro, Nishikasugai-gun (JP); Ryoichi Tohmon, Nishikasugai-gun (JP); Hideaki Kato, Nishikasugai-gun (JP); Satoshi Wada, Nishikasugai-gun (JP)

(73) Assignee: Toyoda Gosei Co., Ltd., Aichi-pref (JP)

( * ) Notice: Subject to any disclaimer, the term of this patent is extended or adjusted under 35 U.S.C. 154(b) by 84 days.

(21) Appl. No.: 10/869,036

(22) Filed: Jun. 17, 2004

(65) Prior Publication Data

US 2004/0257797 A1    Dec. 23, 2004

(30) Foreign Application Priority Data

Jun. 18, 2003   (JP)   ............................ 2003-173650
Sep. 17, 2003   (JP)   ............................ 2003-324570

(51) Int. Cl.
*H01J 63/04*   (2006.01)
*H01J 1/62*    (2006.01)

(52) U.S. Cl. ................ 313/502; 313/483; 313/503; 313/505; 313/506; 313/512

(58) Field of Classification Search ................ 313/502
See application file for complete search history.

(56) References Cited

U.S. PATENT DOCUMENTS

| | | | |
|---|---|---|---|
| 5,962,971 A * | 10/1999 | Chen | 313/512 |
| 6,066,861 A * | 5/2000 | Hohn et al. | 313/486 |
| 6,404,125 B1 * | 6/2002 | Garbuzov et al. | 313/499 |
| 6,466,135 B1 * | 10/2002 | Srivastava et al. | 313/486 |
| 6,577,073 B2 * | 6/2003 | Shimizu et al. | 315/246 |
| 7,091,653 B2 * | 8/2006 | Ouderkirk et al. | 313/502 |
| 7,091,661 B2 * | 8/2006 | Ouderkirk et al. | 313/512 |
| 2001/0000622 A1 * | 5/2001 | Reeh et al. | 257/98 |

(Continued)

FOREIGN PATENT DOCUMENTS

CN   2310388 Y   3/1999

(Continued)

OTHER PUBLICATIONS

First Office Action from Chinese Patent Office issued Sep. 1, 2006 for the corresponding Chinese patent application No. 200410059261.7.

(Continued)

*Primary Examiner*—Sikha Roy
*Assistant Examiner*—Natalie K Walford
(74) *Attorney, Agent, or Firm*—Posz Law Group, PLC

(57) ABSTRACT

A light emitting device has a light emitting element portion that radiates light with a predetermined wavelength, and a wavelength conversion portion that surrounds a phosphor to be excited by the light with the predetermined wavelength with a transparent and non-moisture permeability material in the form of laminae. Further, a light emitting device has a plurality of LED elements disposed on a same plane, and a wavelength conversion portion that comprises a flat transparent base member that is disposed opposite to the plurality of LED elements and a phosphor layer that is of a phosphor to be excited by light emitted from the LED element and is formed like a film on the base member. The phosphor layer includes part with no phosphor in plane.

10 Claims, 22 Drawing Sheets

U.S. PATENT DOCUMENTS

| | | | |
|---|---|---|---|
| 2001/0045573 A1 | 11/2001 | Waitl et al. | |
| 2002/0084748 A1* | 7/2002 | Ayala et al. | 313/512 |
| 2002/0084749 A1* | 7/2002 | Ayala et al. | 313/512 |
| 2002/0158565 A1* | 10/2002 | Setlur et al. | 313/486 |
| 2003/0067264 A1* | 4/2003 | Takekuma | 313/501 |
| 2003/0230751 A1 | 12/2003 | Harada et al. | |
| 2004/0051111 A1* | 3/2004 | Ota et al. | 313/502 |
| 2004/0190304 A1 | 9/2004 | Sugimoto et al. | |

FOREIGN PATENT DOCUMENTS

| | | | |
|---|---|---|---|
| JP | 11-204838 | | 7/1999 |
| JP | 11204838 A | * | 7/1999 |
| JP | A-2000-031547 | | 1/2000 |
| JP | A-2002-022895 | | 1/2002 |
| JP | A-2002-299692 | | 10/2002 |
| JP | A-2003-046134 | | 2/2003 |
| WO | WO 97/50132 | | 12/1997 |
| WO | WO 00/24064 | | 4/2000 |

OTHER PUBLICATIONS

Second Office Action issued Sep. 28, 2007 in corresponding Chinese Patent Application No. 200410059261.7 (and English translation).
Office Action mailed on Aug. 19, 2008 in corresponding Japanese Patetn Application No., 2003-324570 (English translation attached).

* cited by examiner

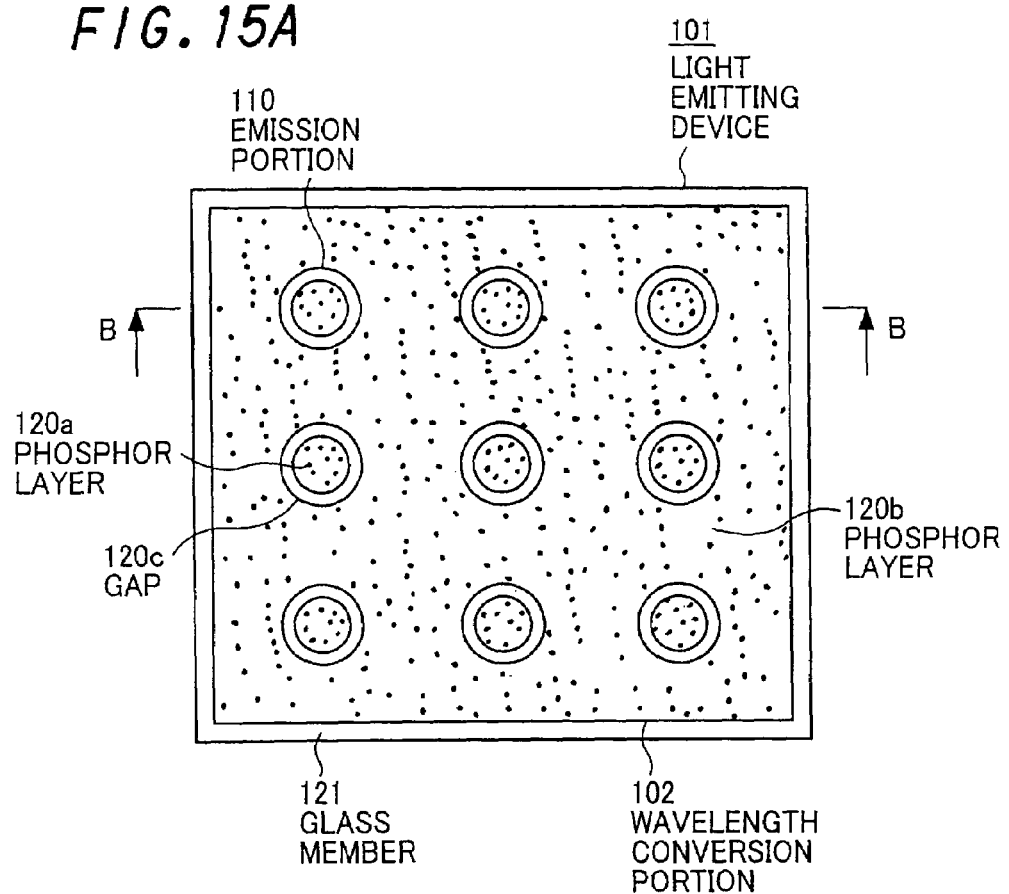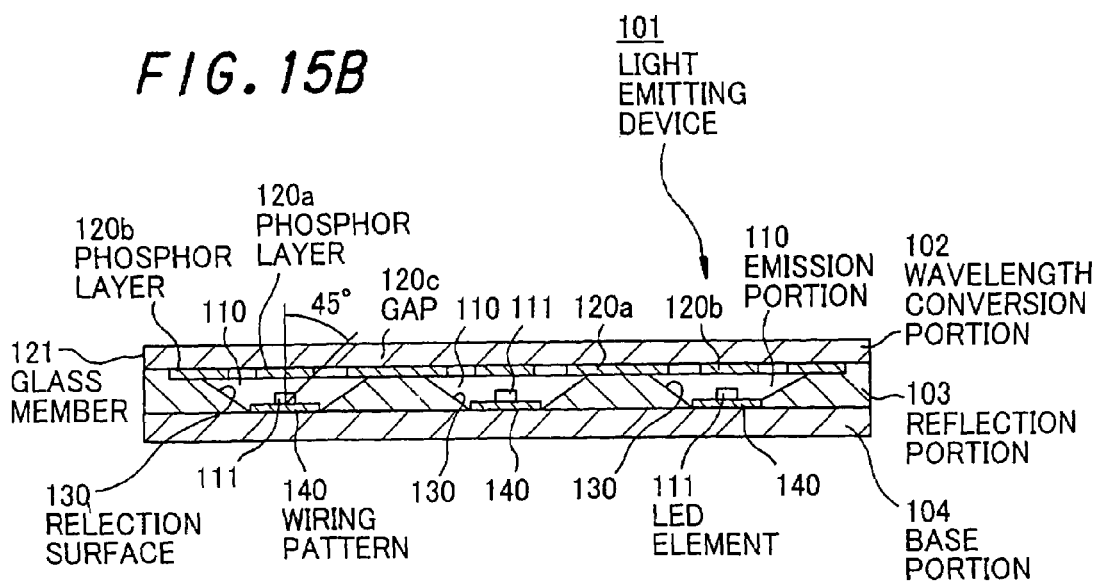

FIG. 16A
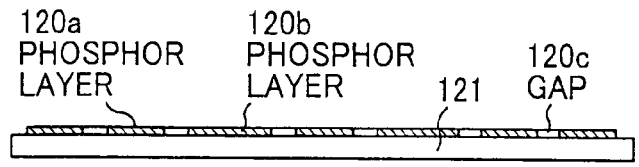
FIG. 16B
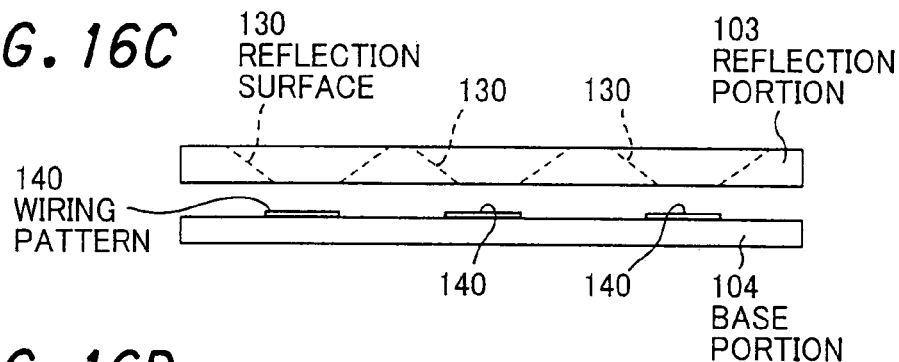
FIG. 16C
FIG. 16D
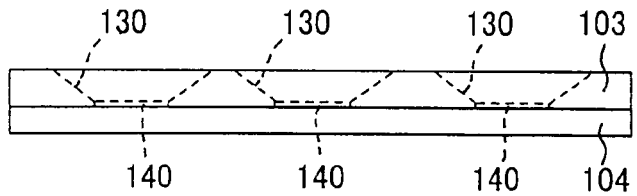
FIG. 16E
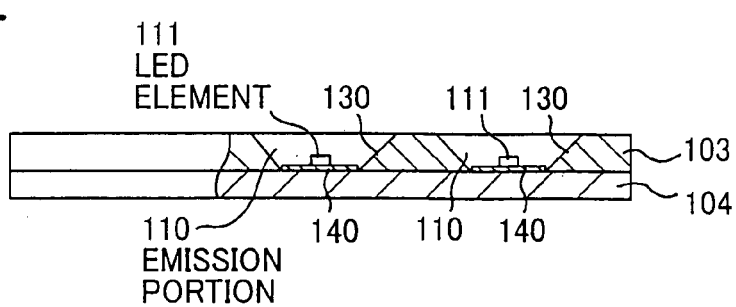
FIG. 16F
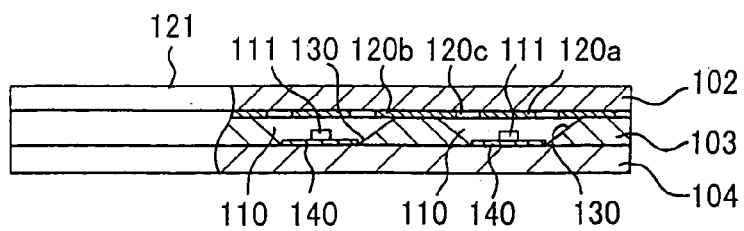

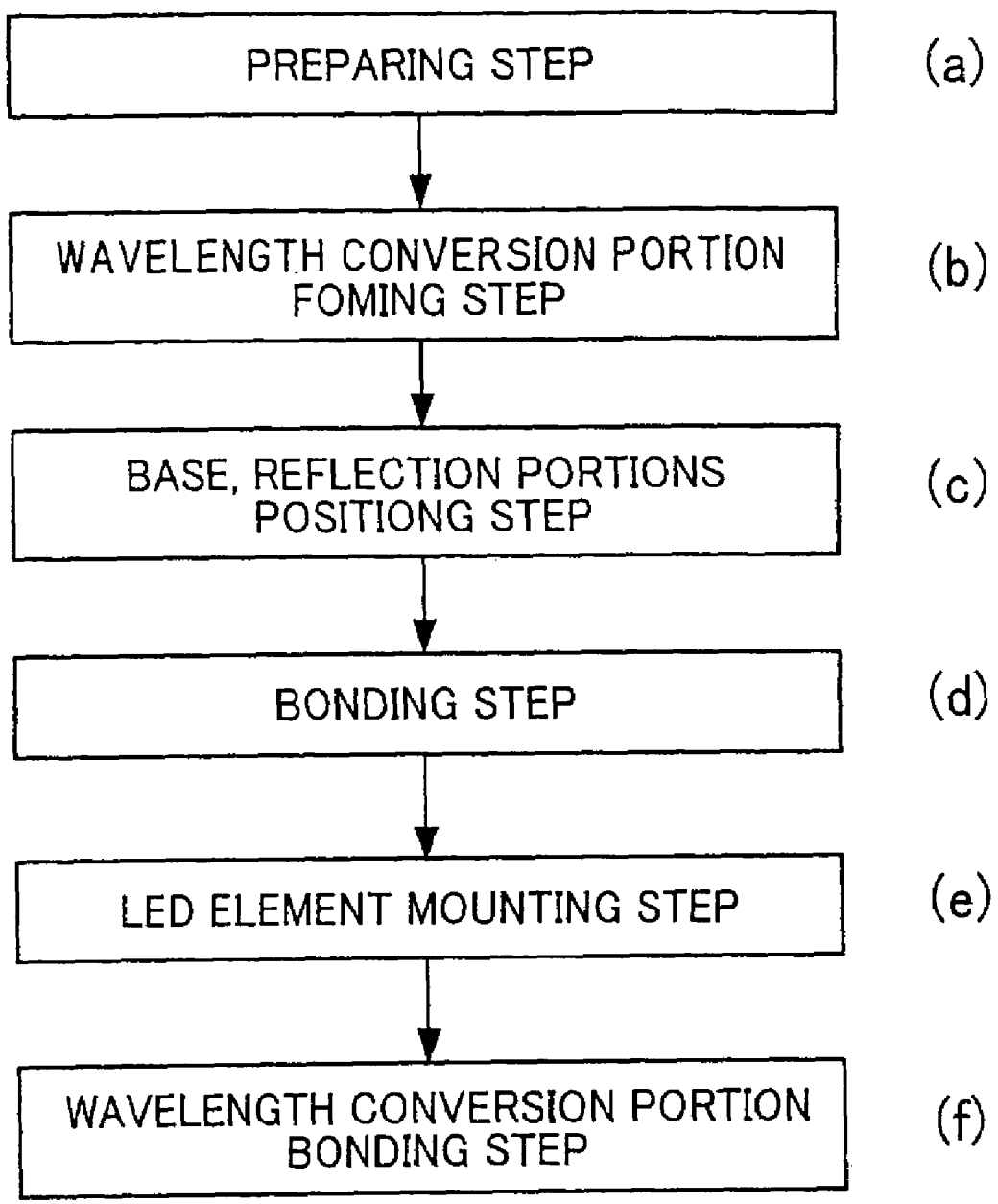

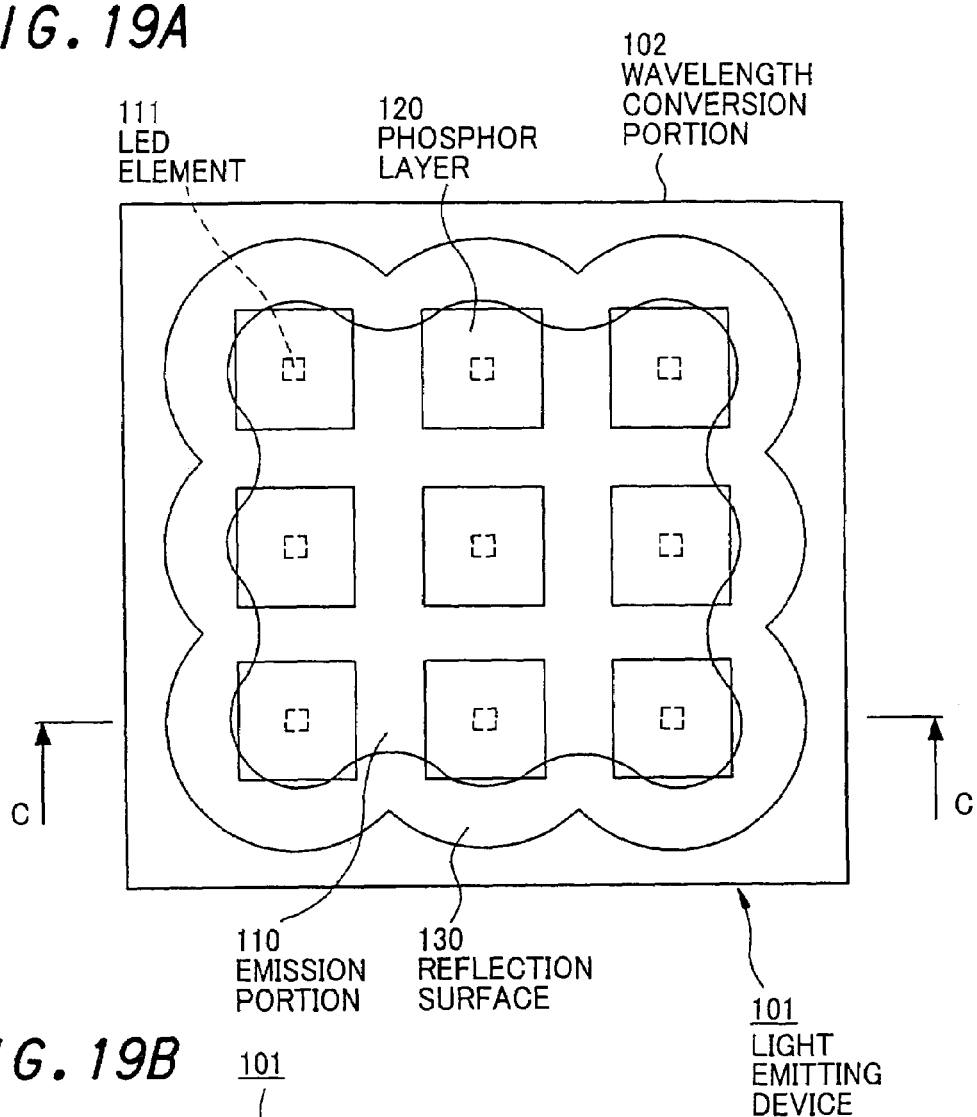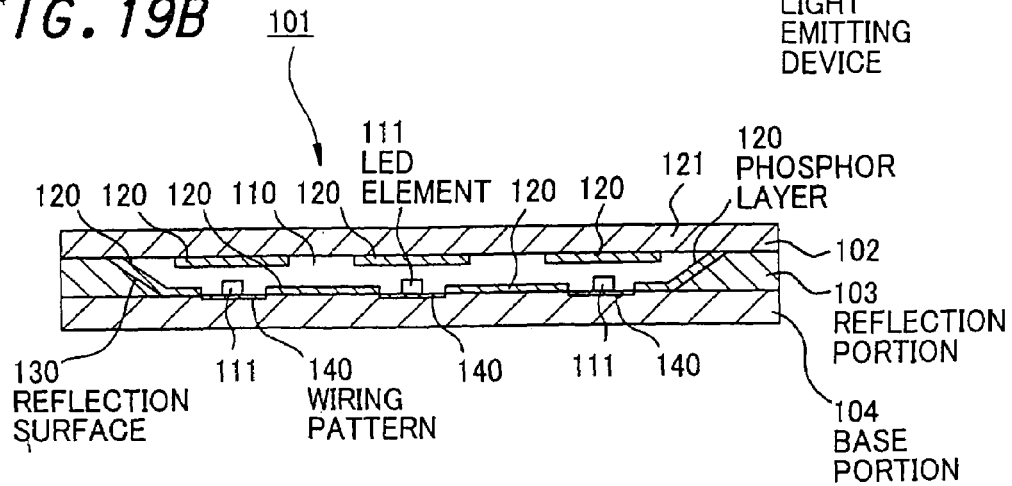

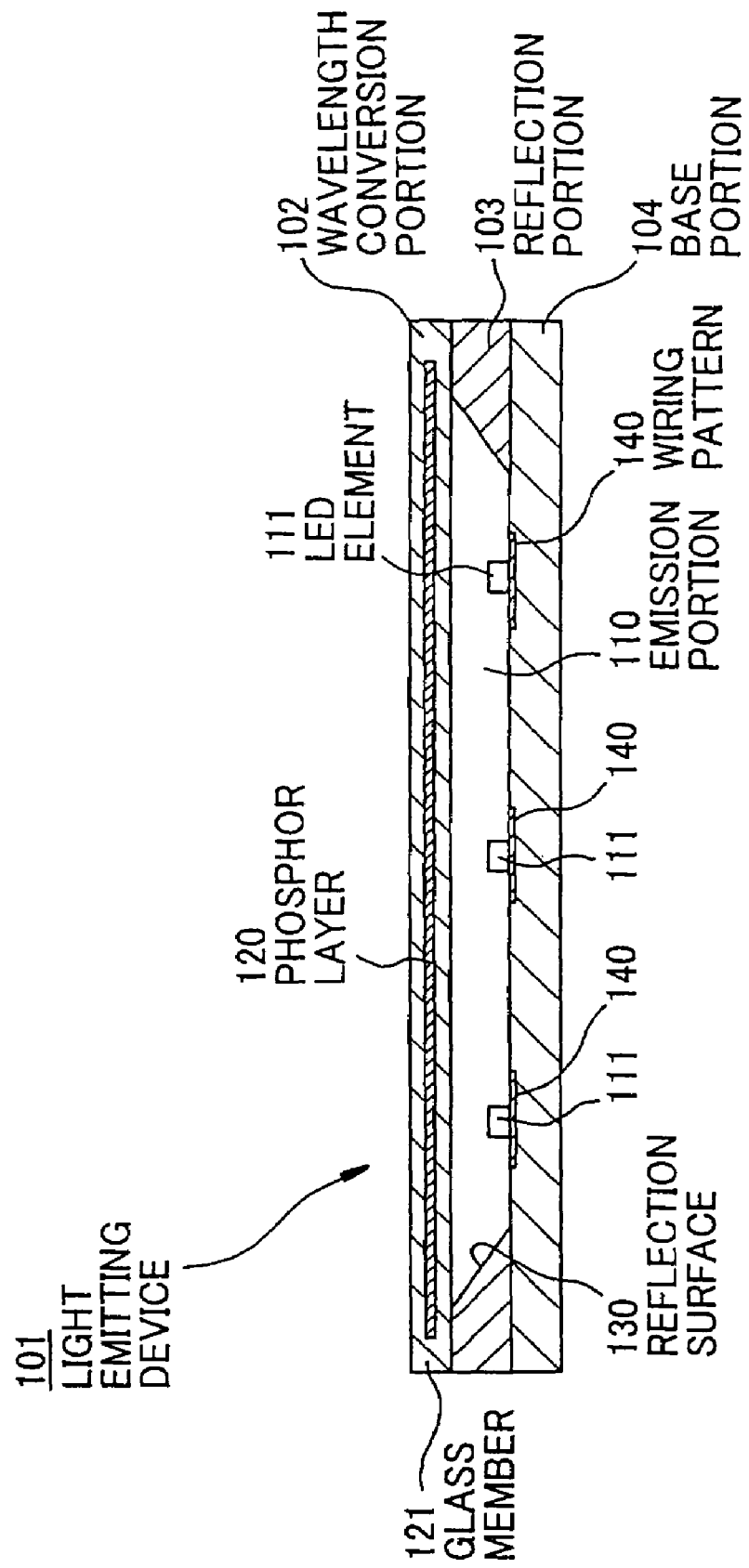

LIGHT EMITTING DEVICE WITH WAVELENGTH CONVERTED BY PHOSPHOR

The present application is based on Japanese patent application Nos. 2003-173650 and 2003-324570, the entire contents of which are incorporated herein by reference.

BACKGROUND OF THE INVENTION

1. Field of the Invention

The invention relates to a light emitting device where light emitted from a light emitting diode (hereinafter referred to as LED) is absorbed and wavelength-converted by phosphor and then the wavelength-converted light with a different wavelength is radiated therefrom.

2. Description of the Related Art

Light emitting devices that allow light emitted from an LED element to be wavelength-converted by phosphor are known. For example, some of the light emitting devices are composed such that phosphors are contained in a sealing resin, such as epoxy resin, to seal the LED element.

By sealing the LED element with sealing resin, a high degree of freedom in designing the light emitting device and an enhanced productivity can be obtained. However, due to the light radiated from the LED element, the optical and chemical characteristics of sealing resin deteriorate and, thereby, the emission efficiency of light emitting device lowers.

Also, there is a problem that the emission efficiency of phosphor lowers. When the device is used under high humidity conditions, the epoxy resin absorbs moisture since it has a moisture absorption property. The moisture absorbed there into causes a deterioration or decomposition in phosphor. As a result, the emission efficiency of phosphor lowers.

Further, it is known that, due to intensive light emitted from the LED element, the epoxy resin becomes colored with time. When the resin is colored, part of light to be emitted from the LED element is absorbed by the resin and, thereby, the optical output of light emitting device lowers.

Japanese patent application laid-open No. 11-204838 (hereinafter referred to as prior art 1) discloses a light emitting device that an LED element is sealed with a glass layer which contains phosphor (See FIG. 1 described ibid.).

FIG. 1 is a cross sectional view showing the light emitting device disclosed in prior art 1.

The light emitting device 30 is composed of: leads 31, 32; a cup portion 33 formed in the lead 33; the LED element 34 bonded onto a bottom portion 33A in the cup portion 33; wires 35 that connects between the electrodes of LED element 34 and the leads 31, 32; a glass layer 36 that seals the LED element 34 filled in the cup portion 33; phosphor 36A contained in the glass layer 36; and transparent sealing resin 37 that is formed into a lamp shape and seals the entire device.

In this composition, since the glass layer 36 with no moisture absorption property is used in place of the epoxy resin, moisture is not penetrated through the glass layer 36 and, therefore, the phosphor does not deteriorate. Further, because of using no epoxy resin, the optical output of light emitting device does not lower.

Japanese patent application laid-open No. 2000-31547 (hereinafter referred to as prior art 2) discloses a light emitting device that multiple LED elements are arrayed like a matrix (plane matrix) and light to be emitted from the LED's is wavelength-converted to offer light with a desired color (See FIG. 2 described ibid.).

FIG. 2 is a cross sectional view showing the light emitting device disclosed in prior art 2.

The light emitting device 50 is composed of: a base 51; a reflection frame 52; recesses 53 provided in the reflection frame 52; a lead 54; LED elements 55; a wavelength conversion sheet 56 that includes a transparent sheet board 56A and a wavelength conversion material layer 56B; and a diffusion plate 57. The interior of recess 53 is filled with mold resin 58. The base 51, reflection frame 52, wavelength conversion sheet 56 and diffusion plate 57 are integrally sealed with the mold resin 58.

The multiple LED elements 55 arrayed in plane are mounted on the base 51, and electric power is supplied to the LED elements 55 through the lead 54 from a power source (not shown). The reflection frame 52 attached to the base 51 allows light emitted from the LED elements 55 to be reflected in the recess 53 and to be radiated upward.

The wavelength conversion sheet 56 is disposed over the reflection frame 52. The wavelength conversion sheet 56 is made such that the wavelength conversion material layer 56B prepared by uniformly mixing a wavelength conversion material into resin binder is coated on the transparent sheet board 56a of sheet resin film, glass etc. and is cured. The wavelength conversion material is excited by light to be emitted from the LED element 55 and radiates excited light. Light with a predetermined wavelength is generated when the excited light is mixed with light to be directly emitted from the LED element 55.

Since light to be emitted from the LED elements 55 arrayed in plane is wavelength-converted by the wavelength conversion sheet 56, the light emitting device 50 can offer a good wavelength conversion efficiency and an even emission color. Therefore, unevenness in emission color can be reduced.

However, the light emitting device in prior art 1 has problems described below.

(1) When the glass layer 36 is filled in the cup portion 33 to seal the LED element 34, the phosphor 36A is deposited collected at a region around the LED element 34. Thereby, emitted light is confined or absorbed by the phosphor-collected region and, therefore, the external radiation efficiency of LED element lowers significantly.

(2) It is very difficult to make the wavelength conversion characteristic even since the disposition of phosphor depends on the filling process of glass material. To prevent this, it is necessary to severely control the mixing state of phosphor to be contained in the glass layer 36.

On the other hand, the light emitting device in prior art 2 has problems described below.

(1) Since light emitted from the LED element 55 cannot be externally radiated without passing through the wavelength conversion material layer 56B, the external radiation efficiency of light emitting device lowers that much.

(2) Since the reflection frame 52, wavelength conversion sheet 56 and diffusion plate 57 are integrally sealed with the mold resin 58, the entire light emitting device must have an increased thickness.

SUMMARY OF THE INVENTION

It is an object of the invention to provide a light emitting device that can offer an even wavelength conversion characteristic while avoiding the lowering of external radiation efficiency of LED element.

It is a further object of the invention to provide a light emitting device that can be low-profile while offering good external radiation efficiency.

According to one aspect of the invention, a light emitting device comprises:

a light emitting element portion that radiates light with a predetermined wavelength; and a wavelength conversion portion that surrounds a phosphor to be excited by the light with the predetermined wavelength with a transparent and non-moisture permeability material in the form of laminae.

It is preferable that the transparent and non-moisture permeability material in the form of laminae to surround the phosphor is of glass. Low-melting glass that is easy to mold at a low temperature can be employed as the glass.

It is preferable that the wavelength conversion portion surrounds and seals the light emitting element portion, and the phosphor is shaped like a thin film and disposed around the light emitting element portion.

The wavelength conversion portion may have an optical shape to radiate the light according to a desired light distribution characteristic from the light emitting element portion.

Further, the wavelength conversion portion may be integrally formed such that the phosphor formed like a thin film on a surface of a first glass material is sandwiched with a second glass material and then thermally fused.

In the above composition, the deterioration of sealing material caused by light to be irradiated thereto from the light emitting element portion, or the deterioration or decomposition in phosphor caused by moisture absorbed can be prevented. As a result, degradation in wavelength conversion characteristic can be prevented.

According to another aspect of the invention, a light emitting device comprises:

a plurality of LED elements disposed on a same plane; and a wavelength conversion portion that comprises a flat transparent base member that is disposed opposite to the plurality of LED elements and a phosphor layer that is of a phosphor to be excited by light emitted from the LED element and is formed like a film on the base member;

wherein the phosphor layer includes part with no phosphor in plane.

It is preferable that the part is located at a region where light component emitted from the LED element and subjected to no reflection in the light emitting device is not allowed to be transmitted through outside the light emitting device.

The light emitting device may further comprise: a plurality of cone-shaped reflection surfaces that are provided corresponding to the plurality of LED elements, wherein the reflection surfaces may be provided with a phosphor layer to be excited by light emitted from the LED element.

The wavelength conversion portion may be structured such that the phosphor layer is sealed in the interior of the base member of transparent glass while being in the form of a film.

The phosphor layer may be partially located corresponding to the LED element.

The base member may be provided with an uneven surface to give a light diffusion property.

In the above composition, since the wavelength conversion portion is structured such that the phosphor layer is disposed directly over the LED element while providing a gap (light-transmitting window) around the phosphor layer, the light emitting device can offer a good wavelength conversion characteristic, a low-profile body and good light extraction efficiency.

BRIEF DESCRIPTION OF THE DRAWINGS

The preferred embodiments according to the invention will be explained below referring to the drawings, wherein:

FIGS. 4A to 4E show a method of making a wavelength conversion portion of the first embodiment, wherein FIG. 4A is a side view showing a glass sheet in preparing step, FIG. 4B is a side view showing the glass sheet in printing step, FIG. 4C is a side view showing the glass sheet in bonding preparation step, FIG. 4D is a side view showing the glass sheet in bonding step, and FIG. 4E is a top view showing the wavelength conversion portion;

FIGS. 5A to 5C show a method of assembling the light emitting device with the wavelength conversion portion, wherein FIG. 5A is a top view showing a lead frame in element mounting step, FIG. 5B is a side view showing the lead frame in sealing preparation step, and FIG. 5C is a top view showing the lead frame in positioning step;

FIGS. 6A to 6C show a method of assembling the light emitting device with the wavelength conversion portion, wherein FIG. 6A is a cross sectional view showing molds in the molding step of wavelength conversion portion, FIG. 6B is a top view showing the lead frame after molding, and FIG. 6C is a cross sectional view cut along the line A-A in FIG. 6B;

FIGS. 12A to 12C show a method of making the light emitting device of the sixth embodiment, wherein FIG. 12A is a top view showing a ceramic substrate with an LED element mounted thereon, FIG. 12B is a top view showing the ceramic substrate with a wavelength conversion portion heat-pressed thereon, and FIG. 12C is a side view showing the ceramic substrate;

FIGS. 15A and 15B show a light emitting device in a ninth preferred embodiment of the invention, wherein FIG. 15A is a top view thereof and FIG. 15B is a cross sectional view cut along the line B-B in FIG. 15A;

FIGS. 16A to 16F are cross sectional views showing a method of making the light emitting device of the ninth embodiment;

FIG. 17 is a flow chart showing the method of making the light emitting device of the ninth embodiment;

FIGS. 19A and 19B show a light emitting device in a tenth preferred embodiment of the invention, wherein FIG. 19A is a top view thereof and FIG. 19B is a cross sectional view cut along the line C-C in FIG. 19A;

FIG. 20 is a cross sectional view showing a light emitting device in an eleventh preferred embodiment of the invention;

DETAILED DESCRIPTION OF THE PREFERRED EMBODIMENTS

Figure 1:
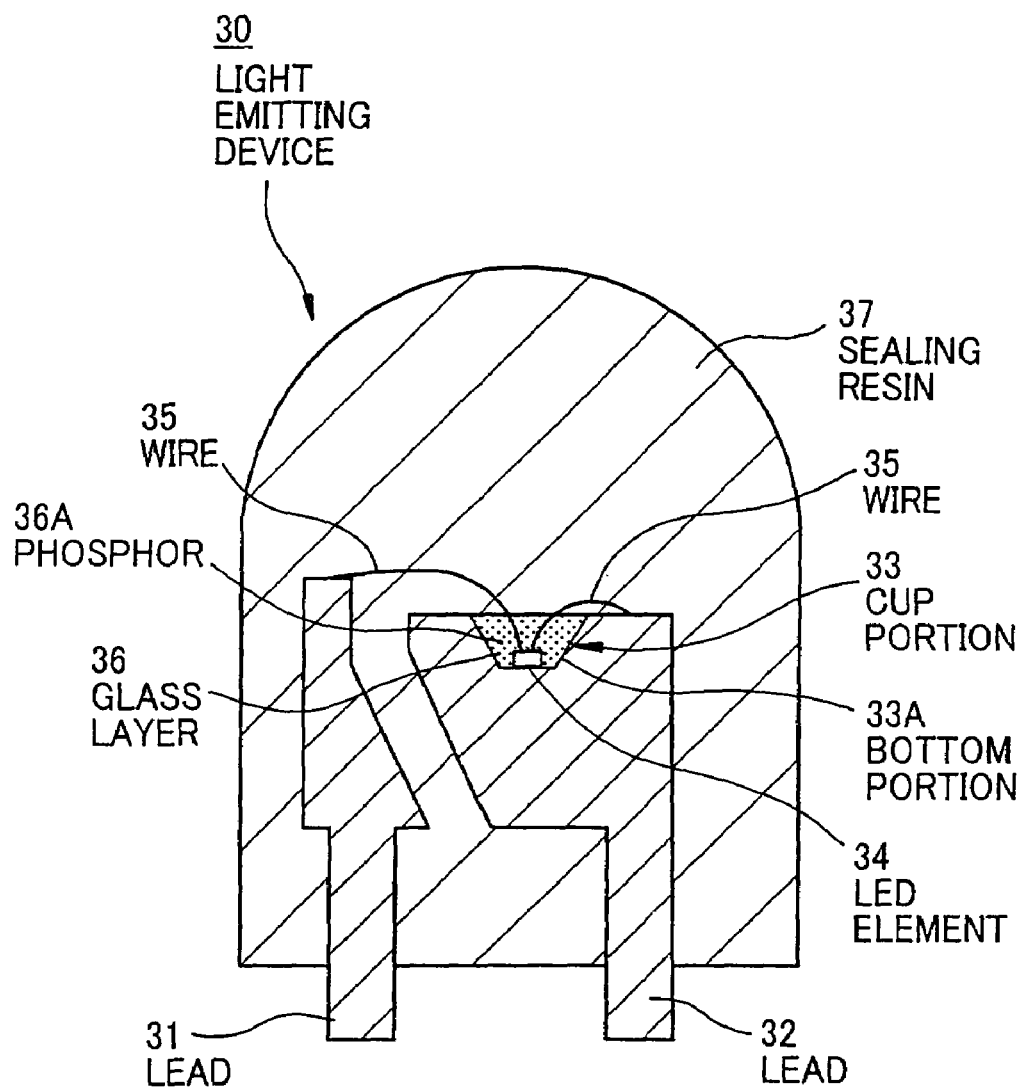
FIG. 1 is a cross sectional view showing the light emitting device disclosed in prior art 1.
Figure 2:
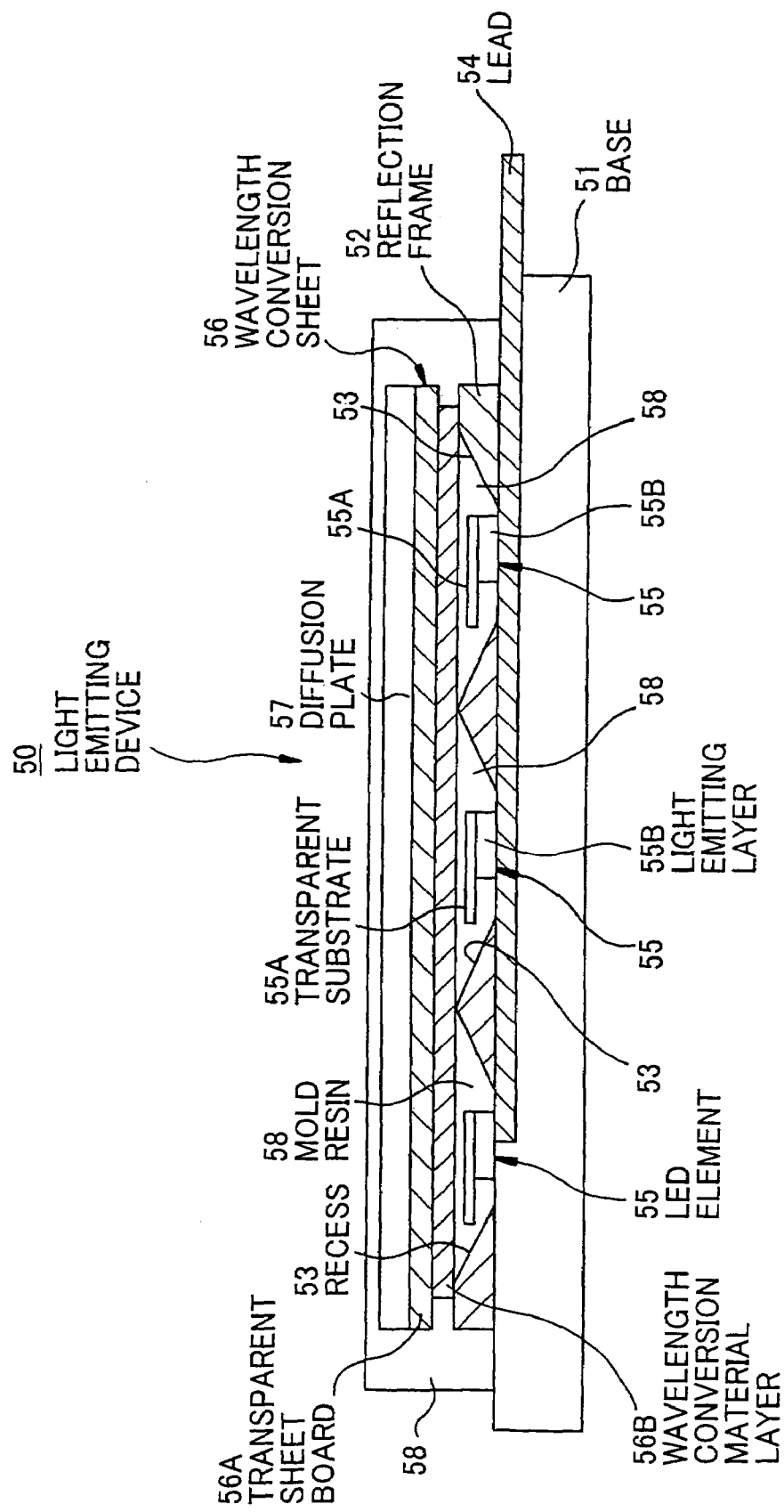
FIG. 2 is a cross sectional view showing the light emitting device disclosed in prior art 2.
Figure 3:
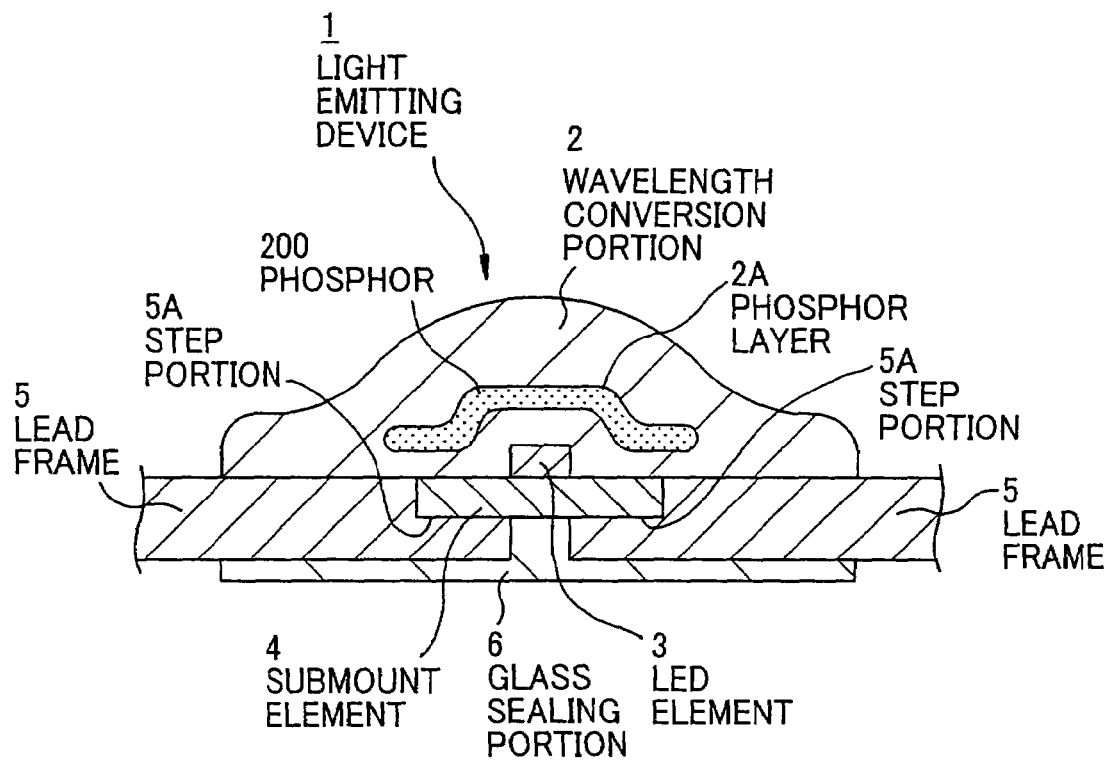
FIG. 3 is a cross sectional view showing central part of a light emitting device in a first preferred embodiment of the invention.

FIG. 3 is a cross sectional view showing central part of the light emitting device in the first preferred embodiment of the invention.

The light emitting device 1 is composed of: a wavelength conversion portion 2 that is of transparent glass material and includes a phosphor layer 2A having a phosphor 200; an LED element 3 that is operable to emit light with a predetermined wavelength; a submount element 4 on which the LED element 3 is mounted; a lead frame 5 that is a wiring conductor to supply electric power to the LED element 3; and a glass sealing portion 6 to protect the bottom surface of lead frame 5.

The wavelength conversion portion 2 is composed such that a thin-film phosphor layer 2A is laid between two layers of transparent low-melting glass with a refractive index of 1.5 and the two glass layers are thermally fused to be integrated with the phosphor layer 2A. Further, the wavelength conversion portion 2 is formed into a dome-like optical shape according to a desired light distribution characteristic by hot pressing, and it seals the LED element 3 while being thermally fused and bonded onto the lead frame 5. The phosphor layer 2A is shaped like a convex polygon to cover the emission observation surface of LED element 3 in accordance with the formation of wavelength conversion portion 2.

The LED element 3 is a flip-chip type light emitting element with an $Al_2O_3$ substrate, and it has an emission wavelength of 380 nm. The LED element 3 has electrodes that are electrically connected through Au bumps (not shown) to a wiring pattern which is formed on the submount element 4.

The submount element 4 is of AlN and has the copper-foil wiring pattern (not shown) formed on its surface. The wiring pattern is electrically connected to the electrodes of LED element 3 and is solder-bonded to the lead frame 5.

The lead frame 5 is of copper or copper alloy and has a Au plating formed on its surface. Its tip portion to be bonded to the submount element 4 is provided with a step 5A in accordance with the thickness of submount element 4. The upper surface of submount element 4 solder-bonded to the step 5A and the upper surface of lead frame 5 have a flat face.

The glass sealing portion 6 is of the same glass material as the low-meting glass to compose the wavelength conversion portion 2. It protects the bottom surface of lead frame 5 while being integrated with the wavelength conversion portion 2 by the hot pressing mentioned above.

FIGS. 4A to 4E show a method of making the wavelength conversion portion 2.

(1) Preparing Step

Figure 4A:
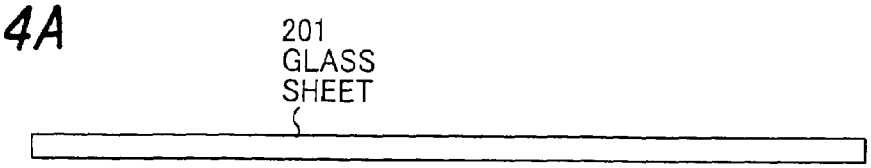

FIG. 4A is a side view showing a glass sheet in preparing step.

At first, the glass sheet 201 which is a sheet of low-melting glass is provided. The glass sheet 201 has a length that allows multiple LED elements 3 to be disposed in the longitudinal direction.

(2) Printing Step

Figure 4B:
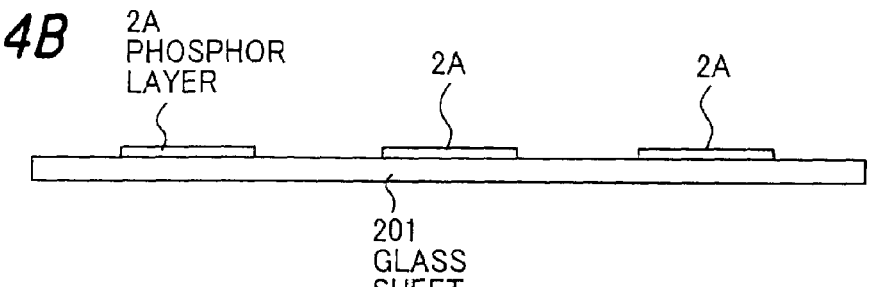

FIG. 4B is a side view showing the glass sheet in printing step.

A phosphor solution is prepared that phosphor 200 is dissolved in n-butylacetate containing around 1% nitrocellulose as a viscosity improver. The solution is deposited like a thin film on the surface of glass sheet 201 by screen-printing at a pitch according to a disposition interval of LED element 3. Then, the glass sheet 201 with the phosphor solution printed thereon is thermally treated to remove the solvent to form the phosphor layer 2A. The thermal treatment may be conducted in reduced-pressure atmosphere.

(3) Bonding Preparation Step

Figure 4C:
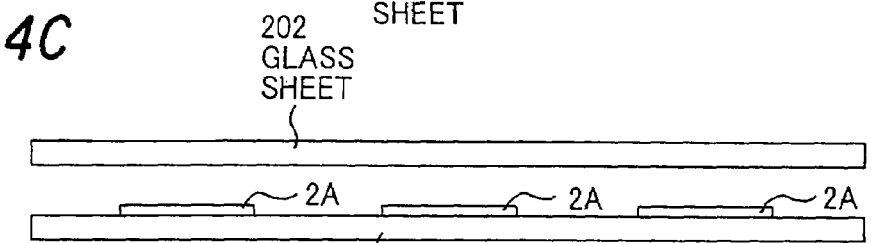

FIG. 4C is a side view showing the glass sheet in bonding preparation step.

A glass sheet 202 is prepared that is of the same low-melting glass as the glass sheet 201. It is disposed on the glass sheet 201 prepared in the printing step to sandwich the phosphor layer 2A. Although it is preferable that the glass sheets 201 and 202 have the same shape, they may have a shape different from each other.

(4) Boding Step

Figure 4D:
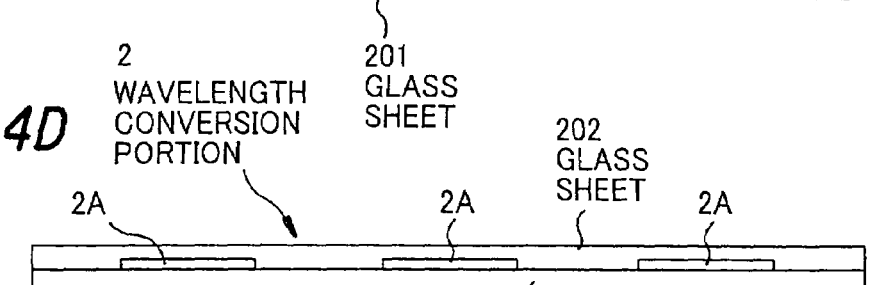

FIG. 4D is a side view showing the glass sheet in bonding step.

The glass sheets 201 and 202 with the phosphor layer sandwiched therebetween are thermally fused and bonded by hot pressing in reduced-pressure atmosphere. The phosphor layer 2A is shaped like a layer such that it is located at the boundary of the thermally bonded glass sheets 201 and 202.

Figure 4E:
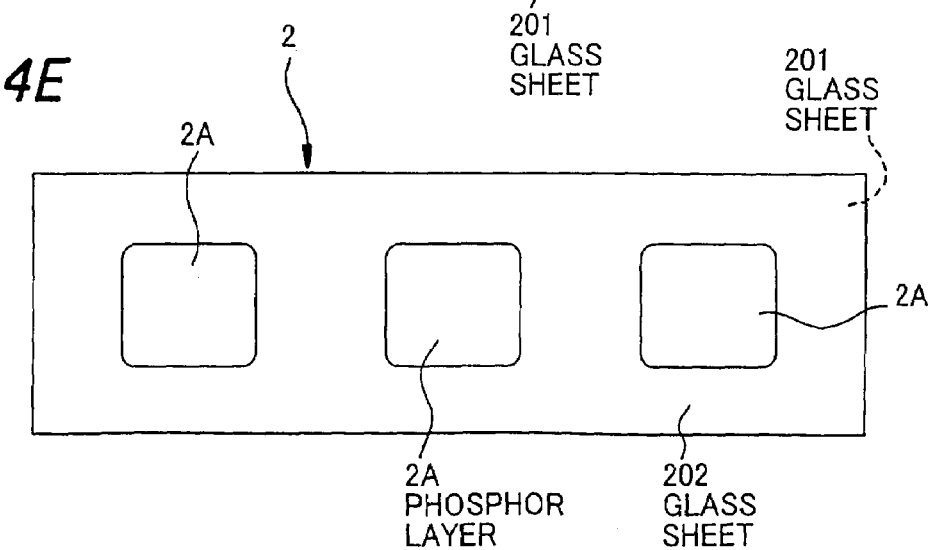

FIG. 4E is a top view showing the wavelength conversion portion.

The wavelength conversion portion 2 is composed such that the phosphor layer 2A shaped by the screen printing is sandwiched by the glass sheets 201 and 202. Although the phosphor layer 2A is shaped like a square in FIG. 4E, it may be shaped into various shapes that can be formed by the screen printing. For example, it may be formed circular.

Figure 5A:
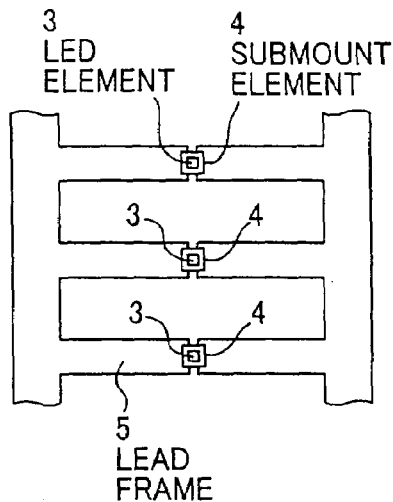
Figure 5B:
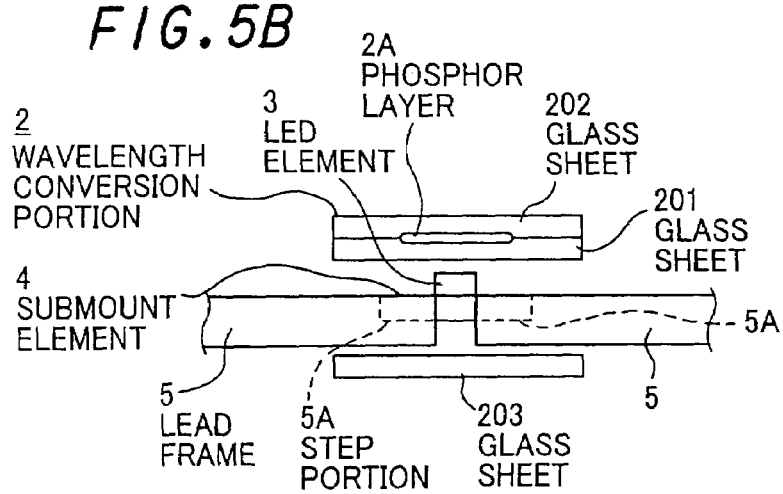
Figure 5C:
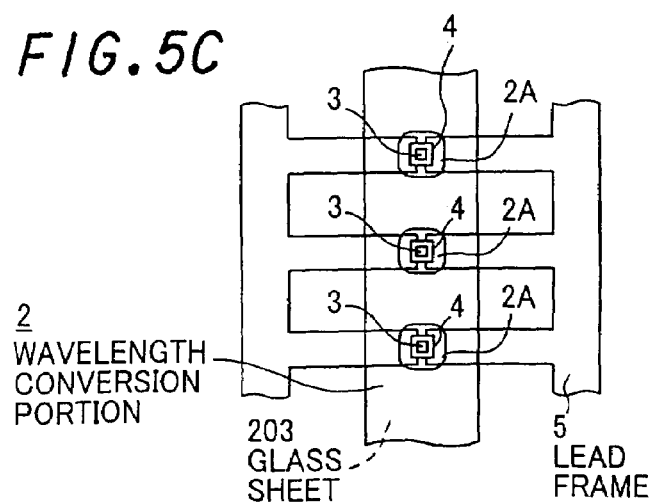

FIGS. 5A to 5C show a method of assembling the light emitting device with the wavelength conversion portion.

(1) LED Element Mounting Step

FIG. 5A is a top view showing the lead frame 5 in element mounting step.

The lead frame 5 is formed by press-stamping a strip of copper alloy. Then, the submount element 4 of AlN is solder-bonded to the lead frame 5. Then, the electrodes of LED element 3 are electrically connected through Au bumps to the wiring pattern (not shown) formed on the submount element 4 while positioning them.

(2) Sealing Preparation Step

FIG. 5B is a side view showing the lead frame in sealing preparation step.

The wavelength conversion portion 2 is disposed on the LED element 3-mounted side of the lead frame 5. Then, glass sheet 203 of low-melting glass is disposed on the bottom side (opposite to the LED element 3-mounted side) of the lead frame 5.

(3) Positioning Step

FIG. 5C is a top view showing the lead frame in positioning step.

The wavelength conversion portion 2, lead frame 5 and glass sheet 203 are positioned such that the phosphor layer 2A of wavelength conversion portion 2 can be disposed at a proper position to the LED element 3.

Figure 6A:
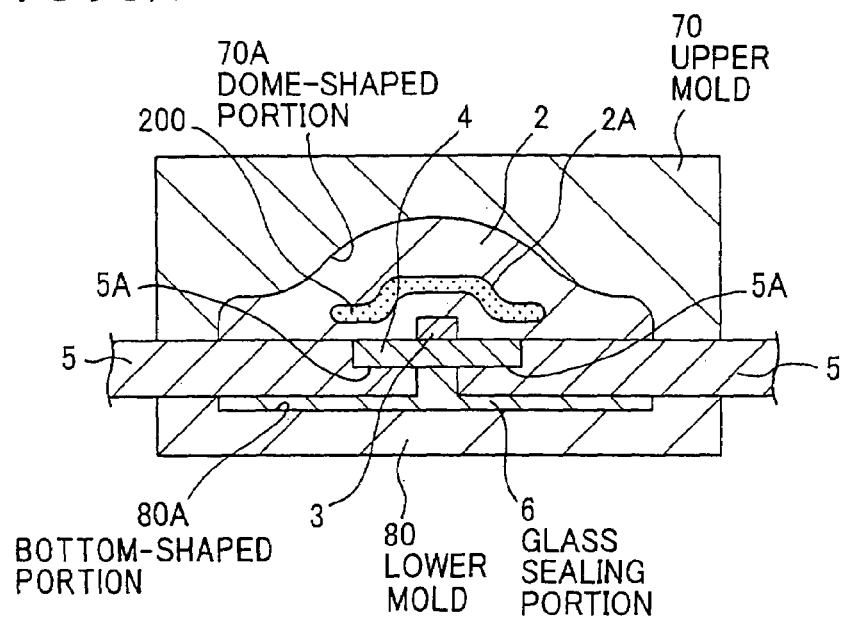
Figure 6B:
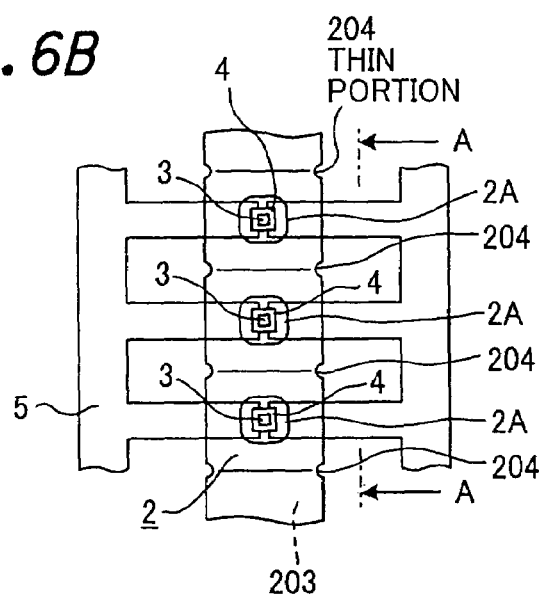
Figure 6C:
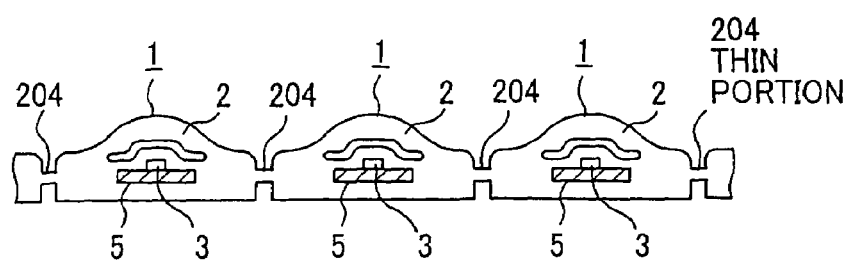

FIGS. 6A to 6C show a method of molding the wavelength conversion portion 2 and the light emitting element with the wavelength conversion portion 2 after the molding.

FIG. 6A is a cross sectional view showing molds used in the molding step of wavelength conversion portion.

The glass material is molded by hot pressing using an upper mold 70 and a lower mold 80 while sandwiching the lead frame 5 between the wavelength conversion portion 2 and the glass sheet 203. The upper mold 70 has a dome-shaped portion 70A that allows the wavelength conversion portion 2 to be provided with a dome-like optical shape. The lower mold 80 has a bottom-shaped portion 80A that allows the bottom of light emitting device 1 to be formed by molding the glass sheet 203. The dome-shaped portion 70A and the bottom-shaped portion 80A may be shaped into a proper form according to the optical characteristic or shape characteristic required to the light emitting device 1.

FIG. 6B is a top view showing the lead frame after molding.

The wavelength conversion portion 2 is provided with a thin portion 204 formed at a region without the lead frame 5 by hot-pressing the upper mold 70 and lower mold 80.

FIG. 6C is a cross sectional view cut along the line A-A in FIG. 6B.

The wavelength conversion portion 2 surrounds the lead frame 5 together with the glass sealing portion 6 to be formed thermally bonded of the glass sheet 203 by hot pressing. On the emission observation surface side of LED element 3, the phosphor layers 2A formed into the convex polygon by the hot pressing are disposed at predetermined intervals. The thin potion 204 has such a thickness that can prevent the breaking of glass material when separating the light emitting device 1 by dicing etc. in the step thereafter.

The operation of light emitting device 1 of the first embodiment will be explained below.

By connecting a power-source line to the lead frame 5 and supplying electric power from a power supply (not shown), the LED element 3 emits light.

Light to be emitted from the LED element 3 except light to be emitted in the horizontal direction is irradiated to the phosphor layer 2A. The phosphor layer 2A radiates excited light when the phosphor 200 is excited by the emitted light. The excited light is mixed with light directly emitted from the LED element 3 to generate a wavelength-converted light. The wavelength-converted light is radiated from the dome-like optical shape portion of wavelength conversion portion 2 to a predetermined direction.

The light emitting device 1 of the first embodiment can have effects described below.

(1) Since the wavelength conversion portion 2 is formed by sandwiching the thin-film phosphor layer 2A formed on the glass sheet 201 with the glass sheet 202 and by thermally fusing them, the shape and thickness of phosphor layer 2A can be easily and accurately controlled. Also, the amount of phosphor used can be accurately controlled. In case of using an expensive phosphor such as YAG (yttrium-aluminum-garnet), the cost of light emitting device 1 can be reduced since the wasting of phosphor can be prevented.

(2) The disposition (distance) between the LED element 3 and phosphor layer 2A can be easily and accurately defined by controlling the thickness of glass sheets 201 and 202. Due to using the glass material, it is highly dampproof and lightfast. Further, the lowering of external radiation efficiency of phosphor can be prevented and a deviation in emission efficiency of each product can be prevented. Thus, the light emitting device 1 can have an enhanced reliability.

(3) Since the LED element 3 is covered with the convex polygon phosphor layer 2A to be formed in accordance with the shape of LED element 3 due to the hot pressing of wavelength conversion portion 2, the phosphor 200 can be evenly excited by light emitted from the LED element 3. Because of this, the wavelength conversion can be evenly performed on the entire phosphor layer 2A and the unevenness in emission color can be prevented.

(4) Since the wavelength conversion portion 2 is longitudinally positioned and integrated by hot pressing to the lead frame 5 with the LED element 3 mounted thereon, multiple light emitting devices 1 can be simultaneously and precisely formed. Thus, a good productivity can be offered.

(5) Even when the amount of heat generation in LED element 3 increases according as the amount of current supplied increases, the radiation property of LED element 3 can be secured by the glass material to compose the wavelength conversion portion 2. Thus, it can be adapted high output and high brightness. Further, due to the enhanced damp-proof property, the light emitting device 1 can be used in the water or under high humidity conditions.

Figure 7:
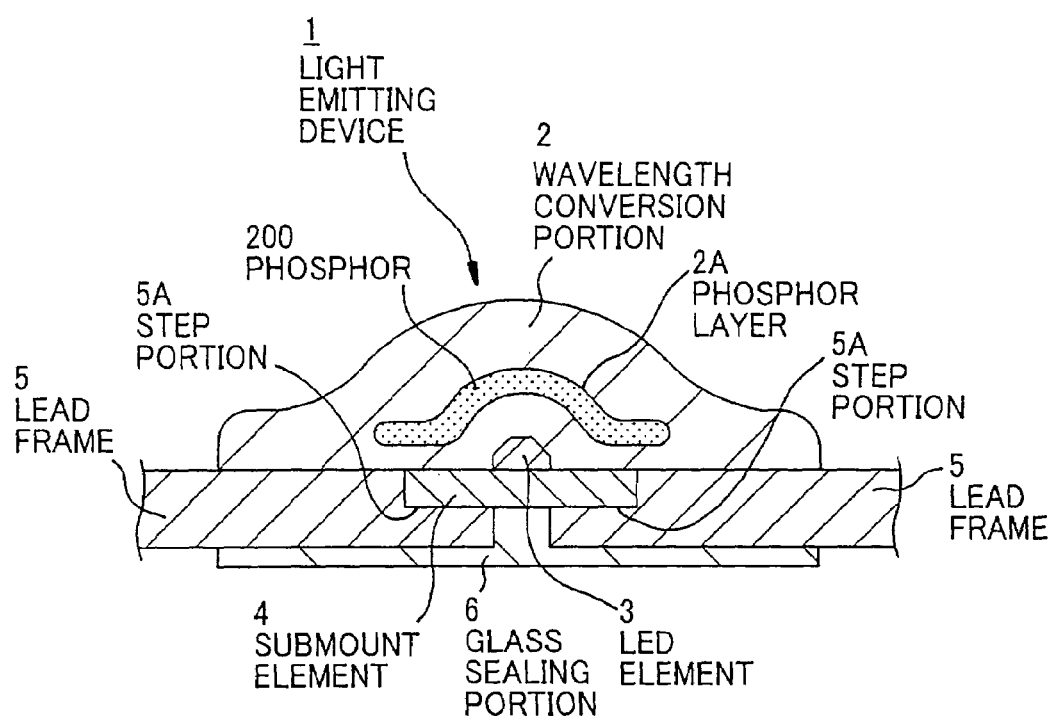
FIG. 7 is a cross sectional view showing central part of a light emitting device in a second preferred embodiment of the invention.

FIG. 7 is a cross sectional view showing central part of a light emitting device in the second preferred embodiment of the invention.

The light emitting device 1 of this embodiment is different from that of the first embodiment in that it is composed of a wavelength conversion portion 2 that is of glass material with a refractive index of n=1.9 and an LED element 3 that includes a GaN substrate with an inclined face to be formed by cutting the corner.

In addition to the effects of the first embodiment, the second embodiment has an effect that the light extraction efficiency from the LED element 3 can be enhanced since the wavelength conversion portion 2 is formed using the high refractive-index glass material.

Further, by providing the LED element 3 with the inclined face formed at the corner, the return light to be reflected by the boundary face laid between the wavelength conversion portion 2 and the LED element 3 can be externally radiated from the LED element 3.

Further, by providing the LED element 3 with the inclined face formed at the corner, the external stress to be applied in glass molding can be released along the inclined face. As a result, the internal remaining stress can be reduced.

Further, due to the inclined face, the remaining gas bubble on the surface of LED element 3 in conducting the glass sealing can be prevented. Therefore, a defect such as crack can be prevented.

Figure 8:
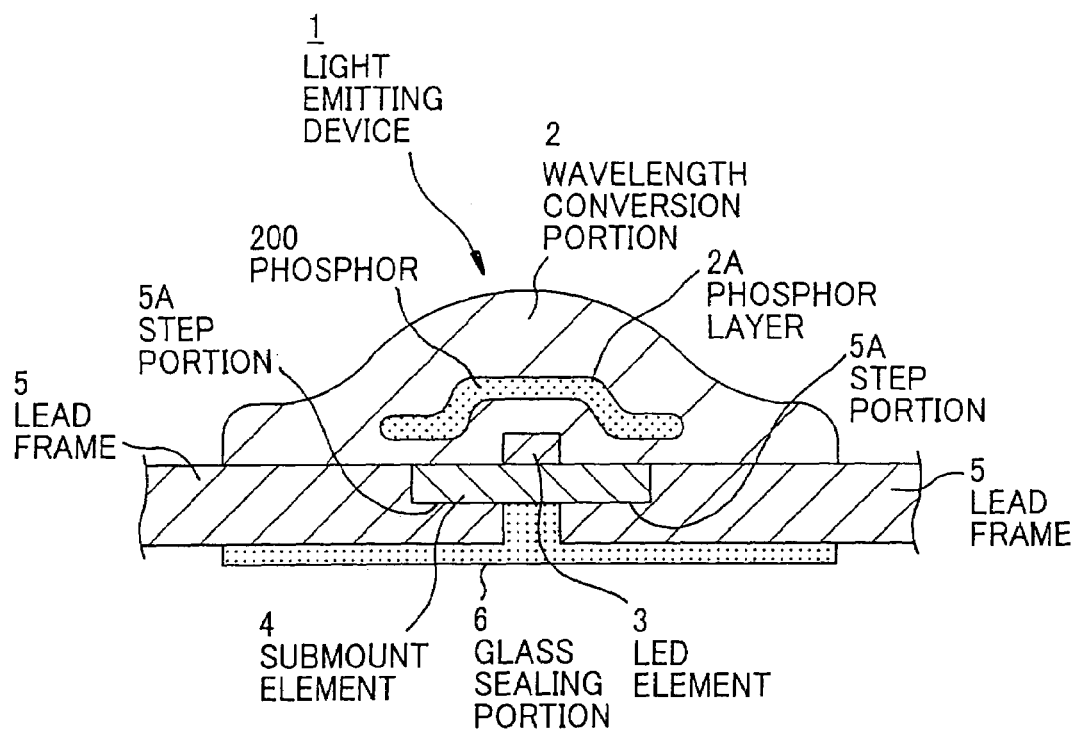
FIG. 8 is a cross sectional view showing central part of a light emitting device in a third preferred embodiment of the invention.

FIG. 8 is a cross sectional view showing central part of a light emitting device in the third preferred embodiment of the invention.

The light emitting device 1 of this embodiment is different from that of the first embodiment in that the glass sealing portion 6 is formed by using a glass sheet 203 of whitish glass.

In addition to the effects of the first embodiment, the third embodiment has an effect that, by providing the glass sealing portion 6 of whitish glass to protect the bottom surface of lead frame 5, light heading from the LED element 3 to the bottom side of light emitting device 1 can be reflected by the whitish glass and radiated in the direction of wavelength conversion portion 2. Thus, the light radiation efficiency can be enhanced.

Figure 9:
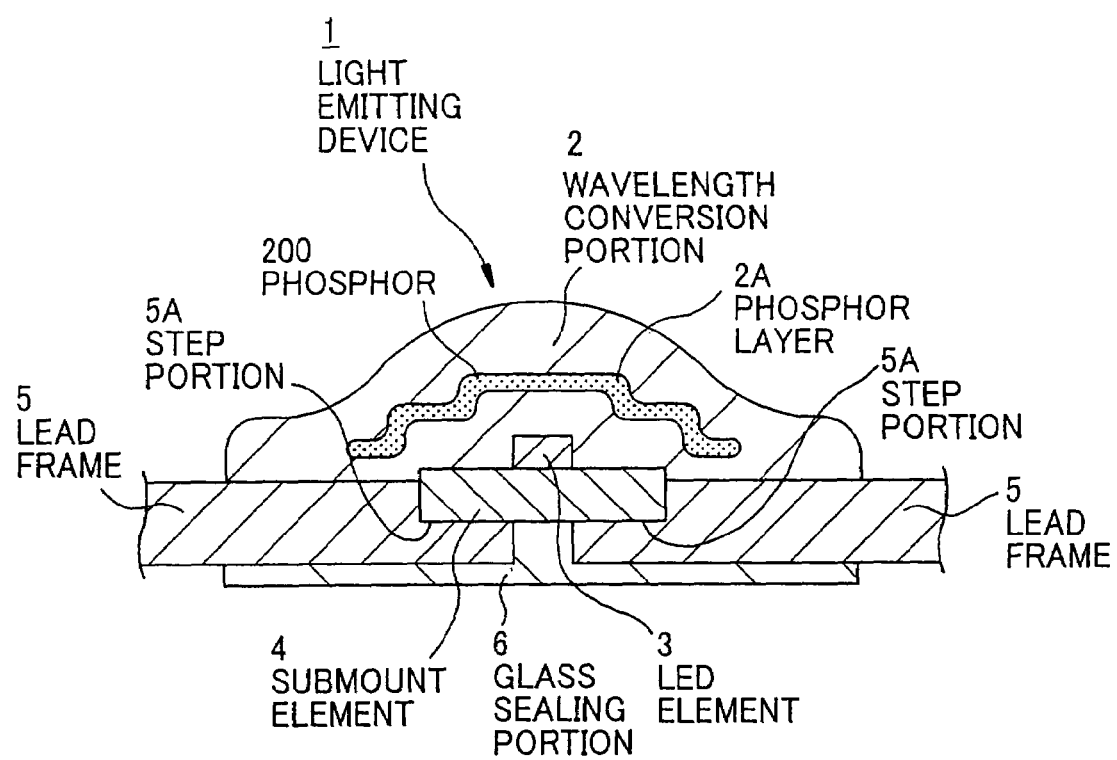
FIG. 9 is a cross sectional view showing central part of a light emitting device in a fourth preferred embodiment of the invention.

FIG. 9 is a cross sectional view showing central part of a light emitting device in the fourth preferred embodiment of the invention.

The light emitting device 1 of this embodiment is different from that of the first embodiment in that the submount element 4 is disposed protruding from the upper surface of lead frame 5, and that the phosphor layer 2A has a shape in accordance with the protrusion shape of LED element 3 and submount element 4 and is disposed at a predetermined distance from the LED element 3 and submount element 4.

In addition to the effects of the first embodiment, the fourth embodiment has an effect that, with the submount element 4 protruding from the upper surface of lead frame 5, most of light emitted from the LED element 3 can be passed through the phosphor layer 2A since the phosphor layer 2A is formed to surround from the emission observation surface to the side face in thermally fusing the wavelength conversion portion 2. Therefore, the wavelength conversion property can be enhanced.

Figure 10:
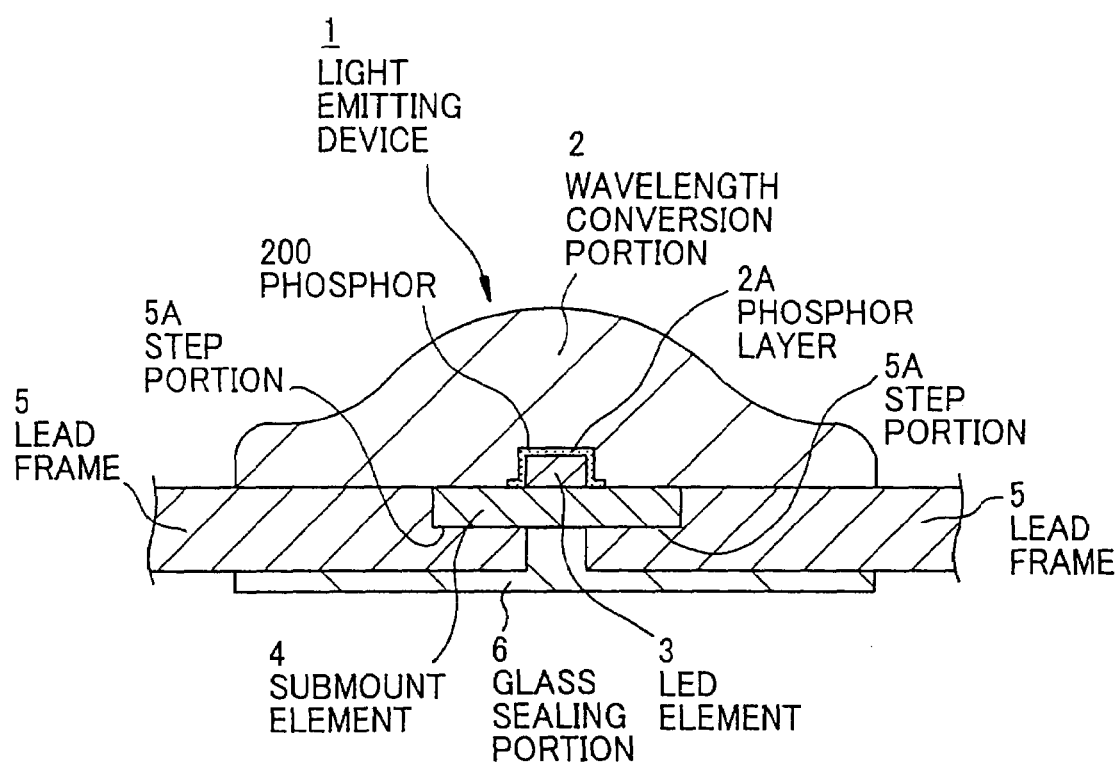
FIG. 10 is a cross sectional view showing central part of a light emitting device in a fifth preferred embodiment of the invention.

FIG. 10 is a cross sectional view showing central part of a light emitting device in the fifth preferred embodiment of the invention.

The light emitting device 1 of this embodiment is provided with a wavelength conversion portion 2 having a phosphor layer 2A that is disposed along the surface of LED element 3 and submount element 4 while removing the glass sheet 202 used in the preceding embodiments. The phosphor layer 2A is, as earlier described in the first embodiment, formed such that the phosphor solution is screen-printed on the surface of glass sheet 201 and then the thermal treatment is conducted to remove the solvent to form the thin-film phosphor layer 2A. The glass sheet 201 is disposed such that its face with the phosphor layer 2A formed thereon is opposite to the LED element 3 and the submount element 4. The glass sheet 203 is disposed under the lead frame 5, and the hot pressing is conducted using the upper mold 70 and lower mold 80 to integrate them.

The fifth embodiment has following effects. Due to using the glass material, it is highly dampproof. Further, since the wavelength conversion portion 2 is formed using the one glass sheet 201, the bonding preparation step and bonding step as described in the first embodiment can be omitted. Therefore, it has a good productivity and a reduced manufacturing cost. Further, since the entire surface of LED element 3 is covered with the thin-film phosphor layer 2A, the wavelength conversion property can be enhanced without lowering the light extraction efficiency.

The phosphor layer 2A may be not necessarily formed on the glass sheet 201, and it may be formed on the LED element 3 by screen printing and, thereby, the same effects can be obtained.

Although in the abovementioned embodiments the LED element 3 is mounted through the submount element 4 on the lead frame 5, the LED element 3 may be mounted on another base material.

Figure 11:
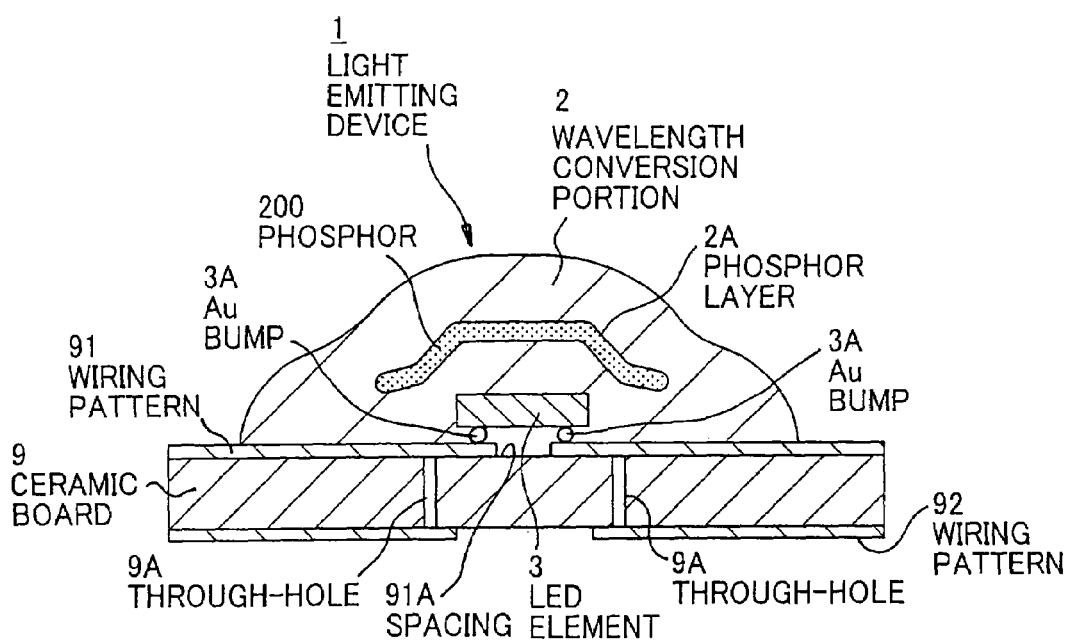
FIG. 11 is a cross sectional view showing central part of a light emitting device in a sixth preferred embodiment of the invention.

FIG. 11 is a cross sectional view showing central part of a light emitting device in the sixth preferred embodiment of the invention.

The light emitting device 1 of this embodiment is different from that of the first embodiment in that it is composed of: a wavelength conversion portion 2 that is of transparent glass material and includes a phosphor layer 2A with phosphor 200; a ceramic board 9 with through-holes 9A; wiring patterns 91, 92 that are of copper foil and formed on the surface of ceramic board 9; a spacing 91A that is provided in the wiring pattern 91; and a LED element 3 that is electrically connected through Au bumps 3A to the wiring pattern 91.

The wiring pattern 91 on the ceramic board 9 is electrically connected through the through-hole 9A to the wiring pattern 92. The wiring pattern 92 is electrically connected to an external circuit (not shown) etc. by solder-bonding etc. The wiring pattern 91 has an enhanced dampproof property due to an adhesion of the glass material to be enhanced by the thermal fusion of wavelength conversion portion 2.

Figure 12A:
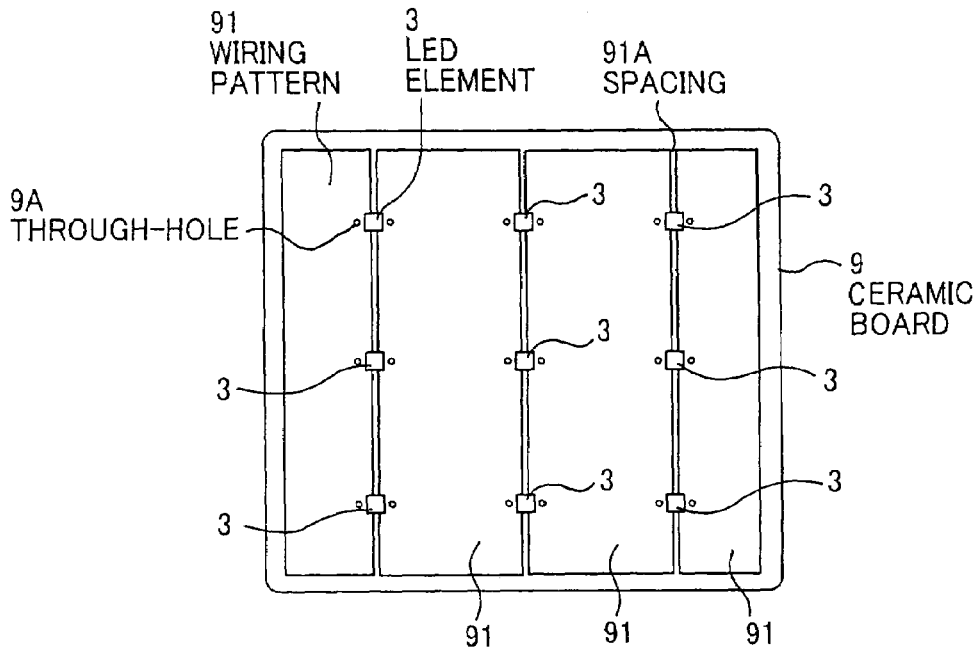
Figure 12B:
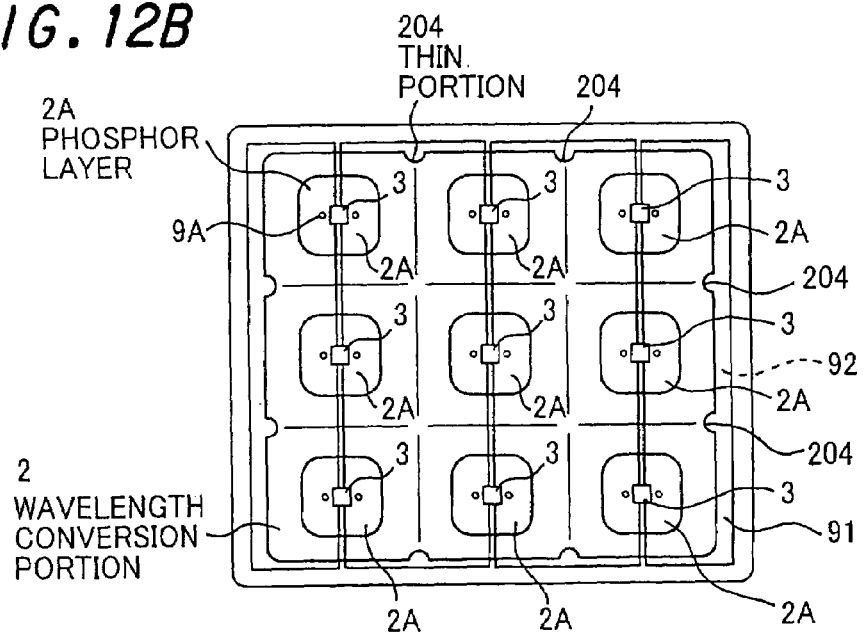
Figure 12C:
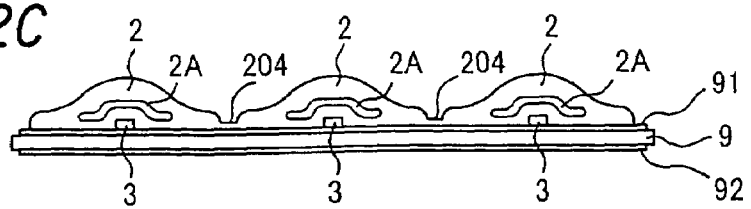

FIGS. 12A to 12C show a method of making the light emitting device of the sixth embodiment. Since the method of making the wavelength conversion portion 2 is similar to that explained in the first embodiment, a method of making the ceramic board 9 will be explained below.

FIG. 12A is a top view showing a ceramic substrate with an LED element mounted thereon.

The ceramic board 9 is formed like a square and has the wiring patterns 91, 92 formed the upper and back surfaces thereof. The LED element 3 is positioned to the wiring pattern 91 and then bonded by Au bumps thereto. In FIG. 12A, the nine LED elements 3 of three rows x three columns are mounted on the wiring pattern 91.

The wavelength conversion portion 2 with a size of smaller than the ceramic board 9 is made in a separate process. The wavelength conversion portion 2 is positioned to the ceramic board 9 with the LED element 3 mounted thereon, and then hot-pressed by using a pair of molds to be closely contacted with the ceramic board 9. The reason why the wavelength conversion portion 2 has a size of smaller than the ceramic board 9 is that it is intended to prevent the glass material fused in hot pressing from reaching the circumference the ceramic board 9 to disturb the separation of molds.

FIG. 12B is a top view showing the ceramic substrate with a wavelength conversion portion heat-pressed thereon.

The wavelength conversion portion 2 is closely contacted with the surface of ceramic board 9 by hot pressing, and it is provided with thin portion 204.

FIG. 12C is a side view showing the ceramic substrate.

By cutting the ceramic board 9 with the wavelength conversion portion 2 along the thin portion by dicing etc., the light emitting device 1 can be separated.

In addition to the effects of the first embodiment, the sixth embodiment has an effect that, by using the ceramic board 9, the LED element 3 can be easily mounted on the wiring pattern 91 without using the submount element 4 and, thereby, the productivity can be enhanced. Further, since the copper foil of wiring pattern 91 can be closely contacted with the glass material of wavelength conversion portion 2, the dampproof property at the boundary between the ceramic board 9 and the wavelength conversion portion 2 can be enhanced.

Although the light emitting device 1 is composed the wavelength conversion portion 2 through which light emitted from the LED element 3 is transmitted, the wavelength conversion portion 2 may be used as a separate wavelength conversion member.

Figure 13:
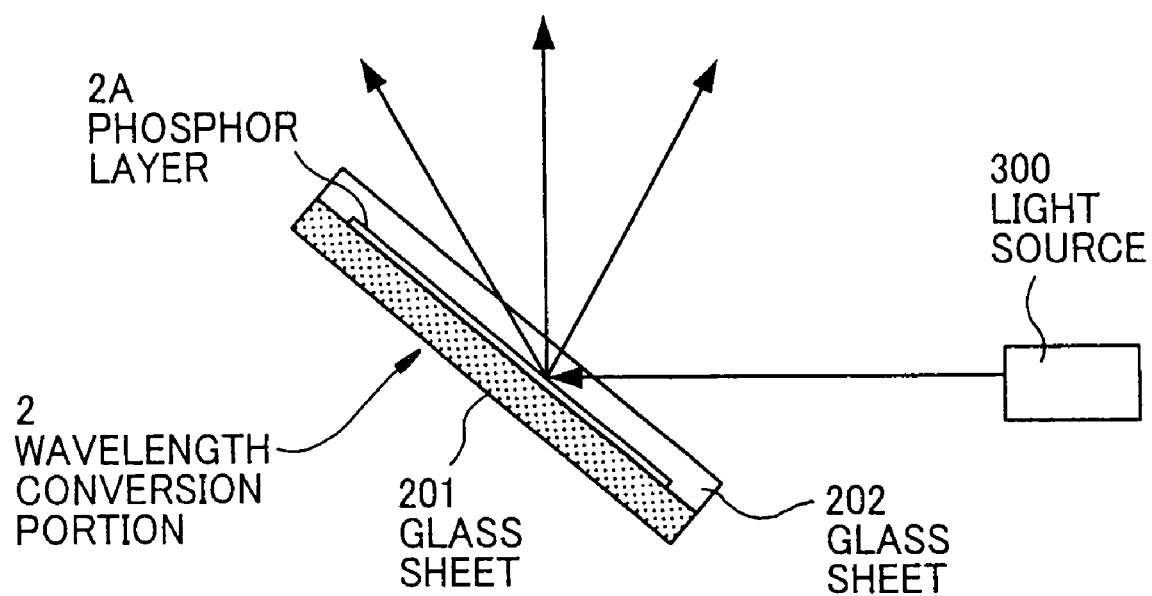
FIG. 13 is an illustration showing the operation principle of a wavelength conversion member in a seventh preferred embodiment of the invention.

FIG. 13 is an illustration showing the operation principle of a wavelength conversion member in the seventh preferred embodiment of the invention.

The wavelength conversion member 2 is composed of a glass sheet 201 of whitish glass, a glass sheet 202 of transparent glass, and a phosphor layer 2A that is sealed sandwiched between the glass sheets 201 and 202. The wavelength conversion member 2 serves to reflect and diffuse light to be radiated from a light source 300 such as a laser diode. A highly reflective metal member such a as aluminum plate may be used in place of the whitish glass.

The seventh embodiment has effects that the wavelength conversion member is highly dampproof because of sealing the phosphor layer 2A with the glass material and, thereby, the phosphor 200 does not deteriorate because of absorbing little moisture, and that it is highly lightfast. Thus, it can offer a stable wavelength conversion property for long hours. Further, since the wavelength conversion member can be provided independently of the light source 300, the wavelength conversion member only has to be exchanged even when it is life-expired or broken. Thus, the wavelength conversion property can be recovered quickly.

Although the wavelength conversion member 2 is of light reflection type, it may be of light transmission type.

Figure 14:
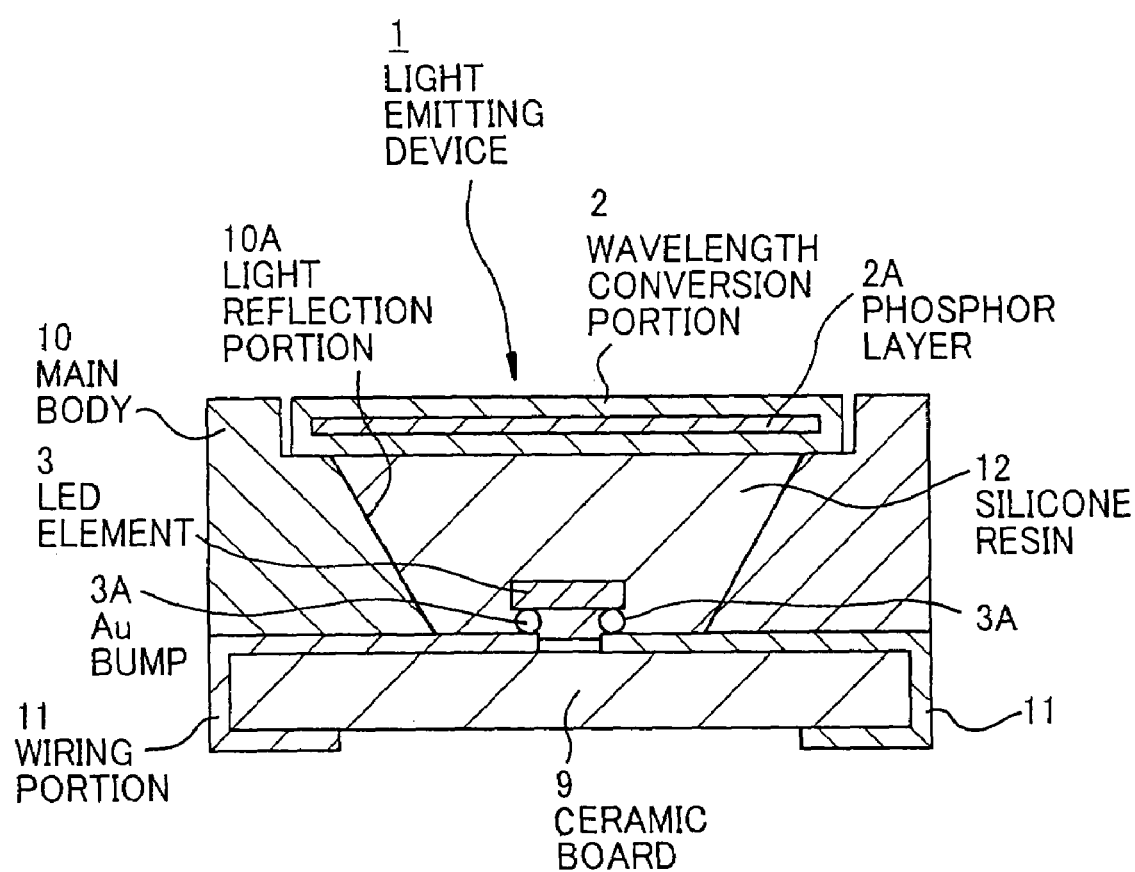
FIG. 14 is a cross sectional view showing a light emitting device with a transparent wavelength conversion portion in an eighth preferred embodiment of the invention.

FIG. 14 is a cross sectional view showing a light emitting device with a transparent wavelength conversion portion in the eighth preferred embodiment of the invention.

The light emitting device 1 is composed of: a main body 10 that is made of resin such as epoxy resin; a light reflection portion 10A that is provided with a slope inside the main body 10; a wiring portion 11 that is of copper foil and exposed at the inside bottom of main body 10; an LED element 3 that is electrically connected through Au bumps 3A to the wiring portion 11; a ceramic board 9 that has the wiring portion formed on the surface and is integrated with the main body 10; and a wavelength conversion portion 2 that is of light transmission type and disposed at the upper opening of main body 10. Silicone resin 12 is filled inside the main body 10.

The eighth embodiment has effects that light emitted from the LED element 3 is irradiated to the wavelength conversion portion 2 disposed at the upper opening of main body 10, the phosphor of phosphor layer 2A is excited thereby, and the wavelength conversion is conducted by mixing light from the LED element 3 with the excited light in the phosphor layer 2A. Thus, the light emitting device 1 of light transmission type is highly dampproof and lightfast and has good light radiation efficiency.

FIGS. 15A and 15B show a light emitting device in the ninth preferred embodiment of the invention, wherein FIG. 15A is a top view thereof and FIG. 15B is a cross sectional view cut along the line B-B in FIG. 15A.

The light emitting device 101 is composed of: a wavelength conversion portion 102 that phosphor layers 120a, 120b are formed on a transparent glass member 121 as a base member; a reflection portion 103 that is a frame member where multiple emission portions 110 are arranged like a matrix; and a base portion 104 that is bonded to the reflection portion 103. The side face of wavelength conversion portion 102, reflection portion 103 and base portion 104 is exposed.

The wavelength conversion portion 102 is composed of: the glass member 121 that is of transparent glass with a refractive index of n=1.5; and the thin-film phosphor layers 120a, 120b that are provided on the reflection portion 103 side, and it is bonded to the reflection portion 103 by adhesion etc. The phosphor layers 120a, 120b are formed by screen-printing a phosphor solution with phosphor dissolved in a solvent on the flat glass member 121, and it is disposed to form a ring-shaped gap 120c and sealed by the bonding between the reflection portion 103 and the base portion 104.

The reflection portion 103 is of highly reflective whitish resin material and has a cone-shaped reflection surface 130 to reflect light emitted from an LED element 111. Transparent silicone resin (not shown) is filled in the emission portion 110. The reflection portion 130 may be of a metal material such as aluminum with good heat conductivity in place of the whitish resin material. However, in this case, it is necessary to consider preventing the short-circuiting to a wiring pattern formed on the base portion. Further, epoxy resin may be filled in the emission portion 110.

The base portion 140 is of ceramics and has a wiring pattern 140 formed using a conductive thin film such as a copper foil on the device mounting surface. The wiring pattern 140 is connected through a through-hole (not shown) to a terminal portion (not shown) provided on the bottom surface of the base portion 104. The LED element 111 is flip-chip bonded onto the wiring pattern 140. The LED element 111 may be face-up bonded other than flip-chip bonding.

The LED element 111 is GaN based blue LED element. It may be a GaN based ultraviolet LED element or another LED element other than GaN based LED elements.

The phosphor layers 120a, 120b contain yellowish phosphor such as YAG (yttrium-aluminum-garnet) to be excited by blue light emitted from the blue LED element. They may contain another phosphor other than YAG.

A composite unit may be composed of the multiple light emitting devices 101 that are arranged linearly or in the vertical and horizontal directions of a plane according to a required light amount or layout. In such a case, the multiple light emitting devices 101 can be integrated by using a frame (not shown) or a bonding member (not shown) and electrically connected.

FIGS. 16A to 16F are cross sectional views showing a method of making the light emitting device of the ninth embodiment. FIG. 17 is a flow chart showing the method of making the light emitting device of the ninth embodiment. The light emitting device 101 of this embodiment is made by conducting: (a) preparing step to prepare the glass member 121 to compose the wavelength conversion portion 102; (b) wavelength conversion portion forming step to integrate the phosphor layers 120a, 120b on the glass member 121; (c) base, reflection portions positioning step to position the reflection portion 103 and base portion 104 at a predetermined accuracy; (d) bonding step to bond the reflection portion 103 to the base portion 104 so as not to generate a gap therebetween; (e) LED element mounting step to mount the LED element 111 on the base portion 104; and (f) wavelength conversion portion bonding step to integrally bond the wavelength conversion portion 102 to the reflection portion 103 and base portion 104.

(a) Preparing Step

At first, as shown in FIG. 16A, the sheet glass member 121 is provided, and it is subjected to pretreatment such as surface washing.

(b) Wavelength Conversion Portion Forming Step

Then, as shown in FIG. 16B, a phosphor solution to be prepared such that phosphor 200 is dissolved in n-butylacetate containing around 1% nitrocellulose as a viscosity improver is deposited like a thin film on the surface of glass member 121 by screen-printing. Then, the glass member 121 with the phosphor solution printed thereon is thermally treated to remove the solvent to form the phosphor layers 120a, 120b.

(c) Base, Reflection Portions Positioning Step

Then, as shown in FIG. 16C, the reflection portion 103 with the reflection surface 130 formed in a separate process is positioned to the base portion 104 with the wiring pattern 140 formed in a separate process.

(d) Bonding Step

Then, as shown in FIG. 16D, the reflection portion 103 and base portion 104 are bonded together using an adhesive etc. This bonding should be conducted so as not to generate a gap between the reflection portion 103 and the base portion 104.

(e) LED Element Mounting Step

Then, as shown in FIG. 16E, the LED element 111 is flip-chip mounted through Au bumps on the wiring pattern 140 on the base portion 104. After mounting the LED element 111 on the base portion 104, the LED element 111 is sealed by filling silicone resin inside the emission portion 110.

(f) Wavelength Conversion Portion Bonding Step

Then, as shown in FIG. 16F, the wavelength conversion portion 102 is bonded through an adhesive etc. so as to cover the upper surface of emission portion 110 sealed with silicone resin. The wavelength conversion portion 102 is bonded such that the phosphor layers 120a, 120b and gap 120c are arranged at the interface between the wavelength conversion portion 102 and the reflection portion 103.

The operation of light emitting device 101 will be explained below.

When electric power is supplied while connecting a terminal portion (not shown) provided on the bottom of base portion 104 to a power-source apparatus (not show), the LED element 111 disposed in the emission portion 110 turns on.

Of light to be emitted from the LED element 111, light to be irradiated directly to the phosphor layer 120 while transmitting through the transparent silicone resin excites the phosphor layer 120. Thereby, excited light with a wavelength different from that of light emitted from the LED element 111 is radiated therefrom. The excited light is mixed with the emitted light from the LED element 111 to generate wavelength conversion light with a predetermined wavelength. Of the wavelength-converted light, one to head to upward is externally radiated through the glass member 121. The other to head to downward is reflected repeatedly and then re-enters into the phosphor layer 120 or is externally radiated from the gap 120c at the circumference of phosphor layer 120. Further, part of light to be transmitted through the glass member 121 is reflected on the interface between the glass and the air and then re-enters into the phosphor layer 120. Thereby, the phosphor layer 120 can be further efficiently excited.

The light emitting device 101 of the ninth embodiment can have effects described below.

(1) Since the wavelength conversion portion 102, reflection portion 103 and base portion 104 are integrally bonded by adhesion etc., the device 101 can be low-profile and downsized as compared to a case that the entire device is sealed with resin.

(2) Since the gap 120c is provided in the phosphor layer 120, light not to be externally radiated through the phosphor layer 120 can be externally radiated through the gap 120c. Thus, the external radiation efficiency can be enhanced. Furthermore, since light to be radiated from the LED element 111 directly to the gap 120c can be reflected at the interface between the glass and the air to re-enter the phosphor layer 120, the external radiation efficiency can be further enhanced.

(3) Since the phosphor layer 120 is formed like a film by screen printing on the glass member 121, unevenness in thickness of the phosphor layer 120 does not occur and, thereby, a uniform and stable wavelength conversion property can be obtained over the entire surface of light emitting device 101. In case of using expensive phosphor such as YAG (yttrium-aluminum-garnet), the cost of light emitting device 101 can be reduced since the wasting of phosphor can be prevented.

(4) Since the phosphor layer 120 is sealed while being disposed at the interface of the wavelength conversion portion 102 and the reflection portion 103, the deterioration of phosphor caused by moisture absorption can be prevented without increasing the device thickness.

Although in the ninth embodiment the wavelength conversion portion 102 is made by forming the phosphor layer 120 on the glass member 121, it may be composite. For example, a phosphor-containing material of glass or resin is shaped like a thin plate and then is integrated on the upper surface of reflection portion 103. Thereby, the entire device can be further low-profile while keeping the uniform wavelength conversion property.

Further, various combinations of LED element 111 and phosphor can be employed other than the above combination. For example, a wavelength conversion device may be composed using an ultraviolet LED element to emit ultraviolet light and RGB phosphors. The number of LED elements may be changed to a desired number.

In order to enhance the heat radiation property of light emitting device 101, for example, the side surface of deice may be roughened to increase the surface area. Furthermore, a heat sink of metal with good heat conductivity such as copper and aluminum may be provided.

Figure 18:
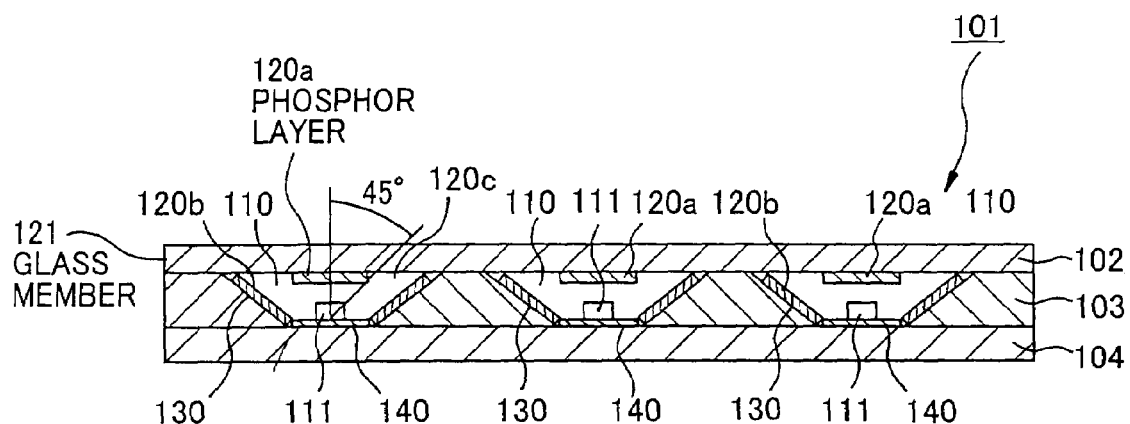
FIG. 18 is a cross sectional view showing a modification of the ninth embodiment.

FIG. 18 is a cross sectional view showing a modification of the ninth embodiment. As shown, the reflection surface 130 of light emitting device 101 may have a phosphor layer 120b formed thereon to allow the wavelength conversion of light to be reflected on the reflection surface 130.

FIGS. 19A and 19B show a light emitting device in the tenth preferred embodiment of the invention, wherein FIG. 19A is a top view thereof and FIG. 19B is a cross sectional view cut along the line C-C in FIG. 19A. Like elements are indicated by the same numerals used in the ninth embodiment.

The tenth embodiment is composed such that nine LED elements 111 are provided like a matrix in one emission portion 110 formed combining multiple emission portions, and that a square phosphor layer 120 is disposed directly over the LED element 111. Further, the reflection surface 130 and base portion 104 are provided with a phosphor layer 120. In the composition as shown in FIG. 19A, the phosphor layer 120 is shaped like a circle other than square. In this case, the phosphor layer 120 is desirably provided in a direction that falls within less than a critical angle to the LED element at the interface of glass member 121 and the air. This is because of preventing light to be externally radiated without reaching the phosphor layer 120 from the LED element 111. The combination of LED element 111 (emission wavelength) and phosphor layer 120 may be not limited to the combination of GaN based LED element and yellowish phosphor layer explained in the ninth embodiment, and another combination may be arbitrarily selected according to use.

In addition to the effects of the ninth embodiment, the tenth embodiment has an effect that the capacity to mount the LED element 111 on the wiring pattern 140 can be increased since the opening of emission portion 110 is enlarged. Furthermore, all the LED elements 111 are simultaneously sealed by filling silicone resin inside the emission portion 110 only once. Therefore, the productivity can be enhanced and the light extraction property can be easily equalized.

FIG. 20 is a cross sectional view showing a light emitting device in the eleventh preferred embodiment of the invention.

The light emitting device 101 of the eleventh embodiment is composed such that the thin-film phosphor layer 120 is sealed in the glass member 121 of the wavelength conversion portion 102 to cover the upper surface of the reflection portion 103.

The wavelength conversion portion 102 is made by providing first and second glass members 121 of low-melting glass, forming the phosphor layer 120 on one of the first and second glass members 121 by using a process as explained in the ninth embodiment, covering the phosphor layer-formed surface with the other glass member 121, thermally fusing the two glass members 121 by hot pressing.

The eleventh embodiment can have an effect that, since the thin-film phosphor layer 120 is sealed the glass members 121, the device can be further low-profile as compared to the light emitting device 101 of the ninth embodiment. Further, due to the phosphor layer 120 sealed with the glass members, the deterioration of phosphor caused by moisture absorption can be prevented and the wavelength conversion property can be stabilized for long hours even under high moisture conditions. Although the phosphor layer 120 may be sandwiched between sheet materials of transparent resin instead of using the glass members 121, it is difficult to perfectly remove the moisture absorption property of the resin material.

Figure 21:
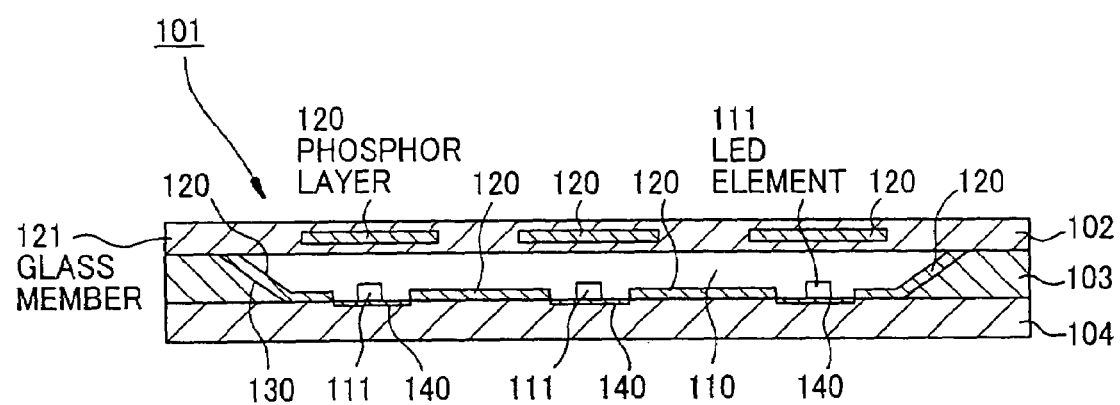
FIG. 21 is a cross sectional view showing a light emitting device in a twelfth preferred embodiment of the invention.

FIG. 21 is a cross sectional view showing a light emitting device in the twelfth preferred embodiment of the invention.

The light emitting device 101 of the twelfth embodiment is composed such that the phosphor layer 120 of wavelength conversion portion 102 described in the eleventh embodiment is partially disposed according to the position of LED element 111.

In addition to the effects of the eleventh embodiment, the twelfth embodiment can have an effect that, since the amount of phosphor used can be reduced, the wavelength conversion property can be stabilized for long hours while lowering the manufacturing cost.

Figure 22:
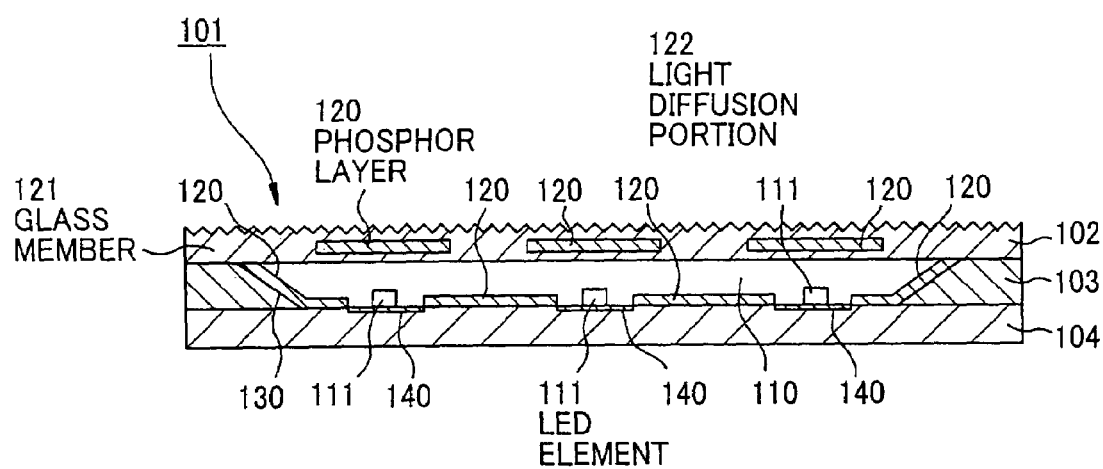
FIG. 22 is a cross sectional view showing a light emitting device in a thirteenth preferred embodiment of the invention.

FIG. 22 is a cross sectional view showing a light emitting device in the thirteenth preferred embodiment of the invention.

The light emitting device 101 of the thirteenth embodiment is composed such that the light emission surface of wavelength conversion portion 102 explained in the twelfth embodiment is provided with uneven portion (light diffusion portion) 122.

In addition to the effects of the twelfth embodiment, the thirteenth embodiment can have an effect that light can be radiated widely from the light emitting device 101. Especially, it is suitable for use, such as a lighting device, where a wide and uniform light radiation characteristic is required.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a light emitting element portion that radiates light with a predetermined wavelength; and
a wavelength conversion portion that comprises:
a phosphor layer to be excited by the light with the predetermined wavelength; and
a transparent and non-moisture permeability material including layers that sandwich the phosphor layer, the transparent and non-moisture permeability material comprising low-melting glass,
wherein the phosphor layer consists essentially of a phosphor without a sealing resin.

2. The light emitting device according to claim 1, wherein:
the wavelength conversion portion surrounds and seals the light emitting element portion, and
the phosphor layer is shaped like a thin film and disposed around the light emitting element portion.

3. The light emitting device according to claim 1, wherein:
the wavelength conversion portion has an optical shape to radiate the light according to a desired light distribution characteristic from the light emitting element portion.

4. The light emitting device according to claim 1, wherein:
the wavelength conversion portion is integrally formed such that the phosphor layer formed like a thin film on a surface of a first glass material is sandwiched with a second glass material and then thermally fused.

5. A light emitting device, comprising:
a plurality of LED elements disposed on a same plane; and
a wavelength conversion portion that comprises:
a flat transparent glass base member that is disposed opposite to the plurality of LED elements to allow light extraction through the base member, the flat transparent glass base member comprising a non-moisture permeability material; and
a phosphor layer that comprises a phosphor to be excited by light emitted from the plurality of LED elements and is formed on the base member;
wherein the phosphor layer is a predetermined patterned layer including gaps therein,
the phosphor layer is disposed directly above and at a distance from the plurality of LED elements, and
the phosphor layer consists essentially of the phosphor without a sealing resin.

6. The light emitting device according to claim 5, wherein:
the gaps are located at a region where a light component emitted from the plurality of LED elements and subjected to no reflection in the light emitting device is not allowed to be transmitted through outside the light emitting device.

7. The light emitting device according to claim 5, further comprising:
a plurality of cone-shaped reflection surfaces that are provided corresponding to the plurality of LED elements,
wherein the reflection surfaces are provided with a phosphor layer to be excited by light emitted from the plurality of LED elements.

8. A light emitting device, comprising:
a plurality of LED elements disposed on a same plane; and
a wavelength conversion portion that comprises:
a flat transparent glass base member that is disposed opposite to the plurality of LED elements to allow light extraction through the base member, the flat transparent glass base member comprising a non-moisture permeability material; and
a phosphor layer including a phosphor to be excited by light emitted from the plurality of LED elements, the phosphor layer having a predetermined pattern with openings and being sealed in an interior of the flat transparent glass base member while being in the form of a film.

9. The light emitting device according to claim 8, wherein:
the phosphor layer is partially located corresponding to the LED element.

10. The light emitting device according to claim 5, wherein:
the base member is provided with an uneven surface to give a light diffusion property.

* * * * *